(12) United States Patent
Takeda et al.

(10) Patent No.: US 6,465,829 B2
(45) Date of Patent: Oct. 15, 2002

(54) SEMICONDUCTOR DEVICE WITH MEMORY AND LOGIC CELLS

(75) Inventors: Shigetoshi Takeda, Kawasaki (JP); Taiji Ema, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/749,463

(22) Filed: Dec. 28, 2000

(65) Prior Publication Data

US 2001/0045589 A1 Nov. 29, 2001

(30) Foreign Application Priority Data

May 26, 2000 (JP) ........................................ 2000-155586

(51) Int. Cl.[7] ............................................. H01L 27/108
(52) U.S. Cl. ........................ 257/300; 257/296; 257/297
(58) Field of Search ................................. 257/296–300

(56) References Cited

U.S. PATENT DOCUMENTS

| | | | | |
|---|---|---|---|---|
| 4,247,919 A | * | 1/1981 | White, Jr. et al. | ........... 365/222 |
| 4,791,606 A | | 12/1988 | Threewitt et al. | |
| 5,146,300 A | | 9/1992 | Hamamoto et al. | ......... 257/300 |
| 5,153,685 A | * | 10/1992 | Murata et al. | ............... 257/296 |
| 5,196,910 A | * | 3/1993 | Moriuchi et al. | ........... 257/296 |
| 5,374,579 A | * | 12/1994 | Kuroda | ........................ 438/639 |
| 5,993,363 A | | 11/1999 | Shindo | |
| 6,320,777 B1 | | 11/2001 | Lines et al. | .................... 365/49 |

FOREIGN PATENT DOCUMENTS

| | | |
|---|---|---|
| JP | 3-166761 | 7/1991 |
| WO | WO 00/60604 | 10/2000 |

OTHER PUBLICATIONS

Lines et al.: "66 MHZ 2.3 M. Ternary Dynamic Content Addressable Memory", IEEE Int. Workshop on Memory Technology, Design and Testing, Aug. 7–8, 2000; pp. 101–105.

* cited by examiner

*Primary Examiner*—Allan R. Wilson
(74) *Attorney, Agent, or Firm*—Armstrong, Westerman & Hattori, LLP

(57) ABSTRACT

A semiconductor device has a plurality of basic units formed on a semiconductor substrate, each including a memory element and a logic element and having the same or bilateral symmetry structure. Each basic unit has a DRAM cell formed in a first active region, serially connected transistors of a logic element formed in a second active region and having second and third gate electrodes and source/drain regions with silicide layers, first and second signal lines connected to the source/drain regions of the transistor pair, a third signal line connected to the second gate electrode, and a conductive connection terminal formed under the storage electrode of a DRAM capacitor for connecting the storage electrode and third gate electrode. A semiconductor device is provided which has a plurality of basic units each including a memory cell and a logic cell formed on the same semiconductor substrate, the device being easy to manufacture and capable of high integration.

21 Claims, 29 Drawing Sheets

FIG.1A
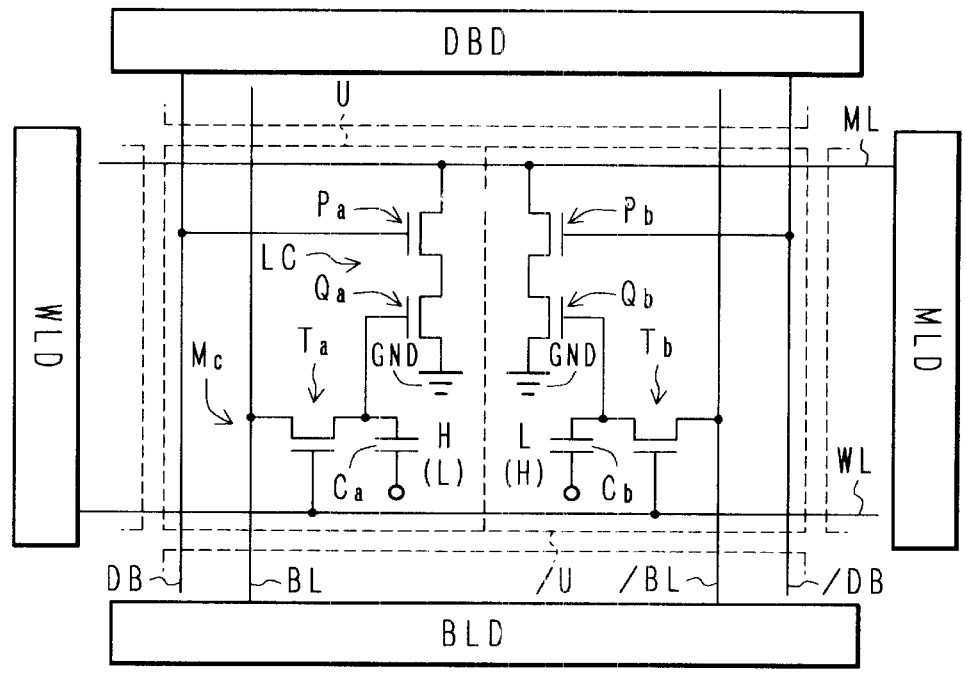
FIG.1B
LEFT=H、RIGHT=L OR
LEFT=L、RIGHT=H    LEFT=RIGHT=L
| DRAM | H | L | H | L | BOTH L |
|---|---|---|---|---|---|
| DB | H | H | L | L | don't care |
| /DB | L | L | H | H | |
| ML | L | H | H | L | H |
FIG.1C
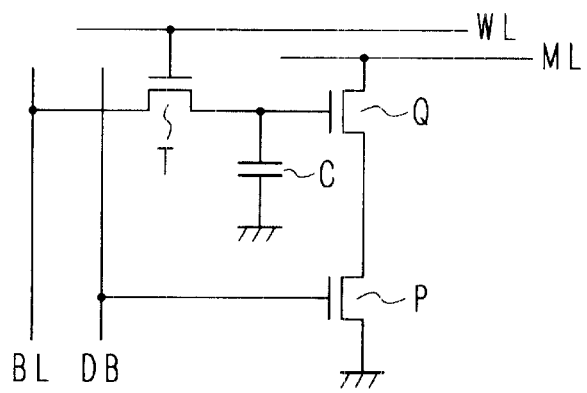

FIG.2A
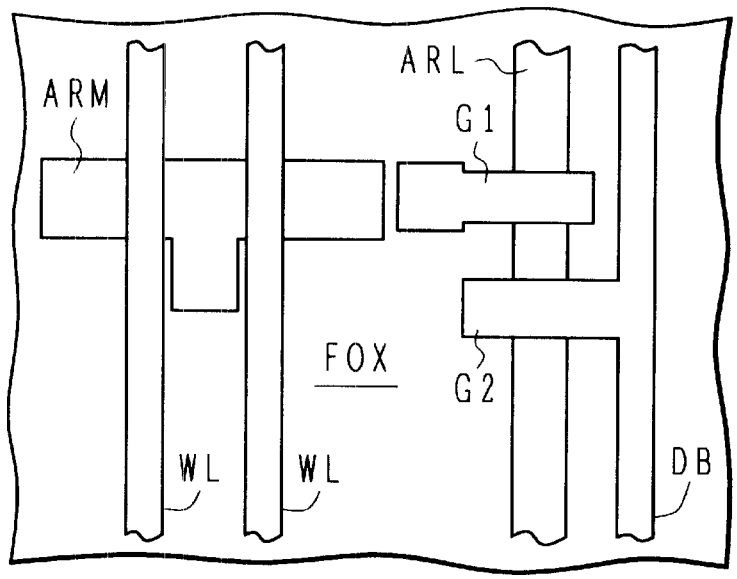
FIG.2B
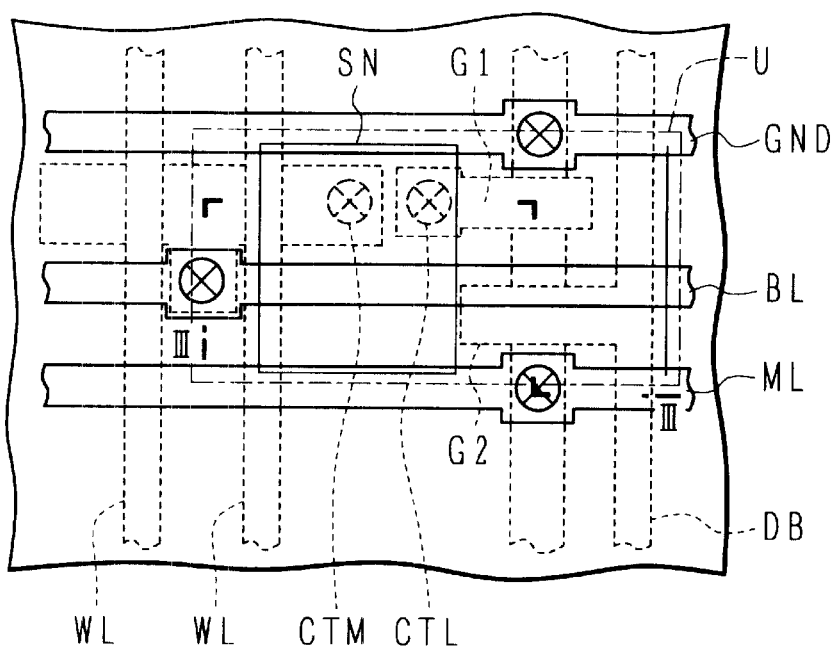
FIG.2C
| $U_{11}$ | $U_{12}$ | $U_{13}$ | $U_{14}$ |
|---|---|---|---|
| $U_{21}$ | $U_{22}$ | $U_{23}$ | $U_{24}$ |
| $U_{31}$ | $U_{32}$ | $U_{33}$ | $U_{34}$ |

| DRAM | H | L | H | L |
|------|---|---|---|---|
| DB | H | H | L | L |
| PMOS | off/off | off/on | on/off | on/on |
| NMOS | on/on | off/on | on/off | off/off |
| ML | H | L | L | H |

SEMICONDUCTOR DEVICE WITH MEMORY AND LOGIC CELLS

This application is based on Japanese Patent Application 2000-155586, filed on May 26, 2000, the entire contents of which are incorporated herein by reference.

BACKGROUND OF THE INVENTION a) Field of the Invention

The present invention relates to a semiconductor device, and more particularly to a semiconductor device having a plurality of basic units each containing a memory cell and a logic cell on the same semiconductor substrate.

b) Description of the Related Art

A content addressable memory (CAM) has become noteworthy in order to realize high sophistication and high speed of an information processing system. CAM has the function that a logic cell can detect a match between the contents stored in a memory cell and externally supplied data. The memory cell is generally made of an SRAM.

Gillingham has proposed a CAM having the structure that the memory cell is made of a dynamic random access memory (DRAM). With this structure, a memory cell of the basic unit can be made of two access transistors, two capacitors, and four search/compare transistors (for a ternary CAM). However, the most efficient structure of CAM and its manufacture techniques are not still established.

SUMMARY OF THE INVENTION

An object of the invention is to provide a semiconductor device having a plurality of basic units each containing a memory cell and a logic cell on the same semiconductor substrate, the device being easy to be manufactured with high integration.

Another object of the invention is to provide a semiconductor device capable of realizing a high performance CAM.

According to one aspect of the present invention, there is provided a semiconductor device comprising a semiconductor substrate and a plurality of basic units formed on the semiconductor substrate each having a memory element and a logic element and a same plan layout or a bilateral symmetry layout, the basic unit comprising: an isolation insulating region formed on a surface of the semiconductor substrate for defining first and second active regions; a transfer transistor having a first gate electrode formed traversing the first active region and a pair of first source/drain regions formed on both sides of the first gate electrode in the first active region; a word line connected to the first gate electrode; a bit line connected to one of the pair of first source/drain regions; serially connected transistors having second and third gate electrodes formed traversing the second active region, a connection node formed between the second and third gate electrodes in the second active region, a pair of second source/drain regions formed outside the second and third gate electrodes, and a suicide electrode formed on the connection node and on the pair of second source/drain regions; a first signal line connected to the silicide electrode on one of the pair of second source/drain regions; a second signal line connected to the silicide electrode on the other of the pair of second source/drain regions; a third signal line connected to the second gate electrode; a storage electrode formed in an area above the other of the pair of first source/drain regions and at least a portion of the third gate electrode; a capacitor dielectric film formed on a surface of the storage electrode; a first conductive connection member formed on and under the storage electrode for connecting the storage electrode to the other of the pair of first source/drain regions; and a second conductive connection member formed on and under the storage electrode for connecting the storage electrode to the third gate electrode.

A semiconductor device with an efficient structure can be provided having a plurality of basic units each having a memory element and a logic element.

An integration degree of CAM can be improved and the manufacture processes can be stabilized.

BRIEF DESCRIPTION OF THE DRAWINGS

FIGS. 1A, 1B and 1C are equivalent circuits of CAM and a logic table. FIGS. 2A, 2B and 2C show a structure in plan views of a repetitive unit of CAM according to an embodiment of the invention.

DETAILED DESCRIPTION OF THE PREFERRED EMBODIMENTS

Figure 3:
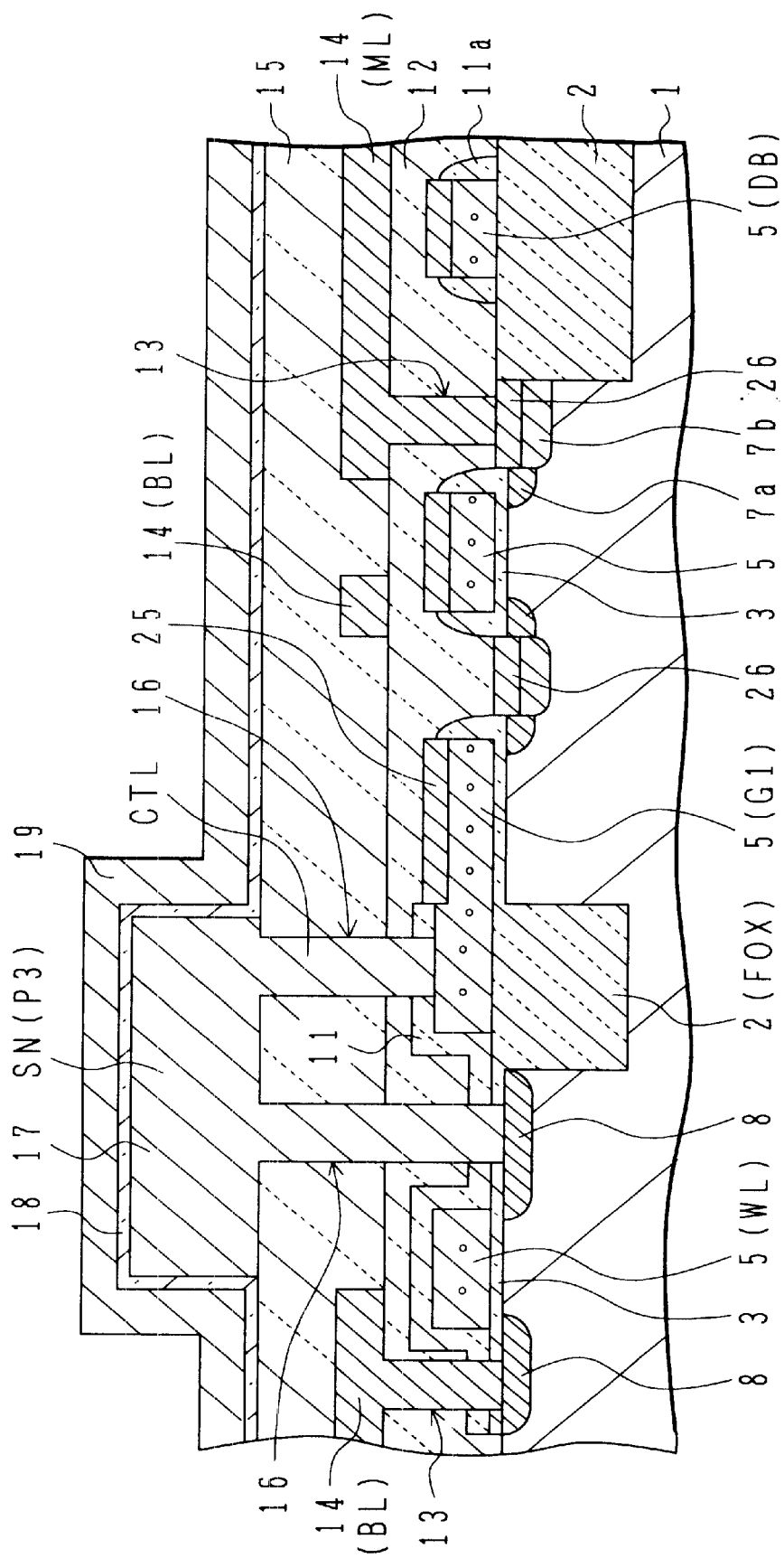
FIG. 3 is a cross sectional view showing the structure of CAM shown in FIG. 2.

FIGS. 1A and 1B show the equivalent circuit and a logical table of a CAM proposed by Gillingham. In FIG. 1A, U and /U represent the structure of repetitive units. U and /U having the symmetrical structure constitute one CAM unit (basic unit). A plurality of CAM units are disposed in a matrix shape.

Bit lines BL and /BL of a memory cell MC are usually supplied with complementary data. Transfer transistors Ta and Tb are controlled to be turned on and off by a signal on the same word line WL. Complementary data is written via the transfer transistors Ta and Tb into capacitors Ca and Cb.

Serially connected transistors Pa and Qa and serially connected transistors Pb and Qb constitute a search/compare logic cell LC. One ends of the serial connections (ones of source/drain electrodes of transistors Qa and Qb) are connected to a ground line (GND). The other ends of source/drain electrodes of transistors Pa and Pb serially connected to transistors Qa and Qb are connected to the same match line ML.

The potentials at the storage electrodes of the capacitors Ca and Cb are applied to the gate electrodes of the transistors Qa and Qb of the logic circuit.

The on/off states of the transistors Qa and Qb of the logic circuit are therefore controlled by the potentials at the storage electrodes of the capacitors Ca and Cb. The gate electrodes of the transistors Pa and Pb are connected to data bus lines DB and /DB, which carry search data to be compared against data stored in the CAM cells.

The layout of the transistors P (Pa, Pb) and Q (Qa, Qb) may be reversed as shown in FIG. 1C.

In a search and compare operation, the match line ML is precharged to a logic high and a signal and its complementary signal are input to the data bus lines DB and /DB. Subsequently one of the transistors Pa and Pb turns on and the other turns off. If the transistor Qa or Qb serially connected to the turned-on transistor Pa or Pb is on, the potential of the pre-charged match line ML is discharged to the ground line so that the potential of the match line ML changes, indicating that a match between the search and stored data has occurred, otherwise referred to as a fit.

If the transistor Qa or Qb serially connected to the turned-on transistor Pa or Pb is off, the match line ML will not be discharged so that the potential of the match line ML is maintained in the pre-charged state, indicating a miss-match or a miss. The potential change of the match line ML is therefore controlled by the serial connection connected to the high state memory (Ca or Cb).

The bit lines BL and /BL connected to the memory cell MC are connected to a bit line driver circuit BLD, and the word line WL is connected to a word line driver circuit WLD. The data bus lines DB and /DB are connected to a data bus driver circuit DBD, and the match line ML is connected to a match line driver circuit MLD. The data bus line driver circuit DBD may be a terminal itself to which an external signal is input, or a buffer circuit for temporarily storing an external signal. FIG. 1B illustrates the logic function of the CAM cell unit shown in FIG. 1A. A DRAM row field indicates the charge status of the memory cell MC, or more specifically, of the capacitor Ca or Cb of DRAM. When the capacitor Ca is charged to a high potential, it takes a high (H) level, whereas when it is charged to a low potential, it takes a low (L) level.

The capacitor Cb usually stores a complementary signal to a signal in the capacitor Ca. When DRAM or more specifically the capacitor Ca takes the high (H) level, the transistor Qa is on and the transistor Qb is off. Therefore, only when the transistor Pa serially connected to the turned-on transistor Qa becomes on (only when the data bus line DB becomes high), the potential of the match line ML is discharged to the ground line. Namely, when the potential of the data bus line DB is high (H), the match line ML is low (L).

If DRAM takes the low level, the capacitor Cb stores a high level potential and the transistor Qb becomes on. Therefore, only when the transistor Pb serially connected to the turned-on transistor Qb becomes on (only when the data bus line /DB becomes high), the potential of the match line ML is discharged and takes the low (L) level. In the case other than the above two cases, the potential of the match line ML is maintained high (H). In the case when the two DRAMs are both in L state, the match line ML is maintained high (H), regardless of the level of the data bus DB.

This is called "don't care". This circuit can also achieve this (ternary logic). This logic calculation is summarized in the table shown in FIG. 1B.

In FIG. 1A, the repetitive units U and /U are structured symmetrically. In an actual semiconductor device, it is preferable to use the repetitive units U and /U having the same structure or a right/left bilateral symmetry structure.

FIG. 2A and 2B show an example of the layout of repetitive units U shown in FIG. 1A. FIG. 2A shows active regions defined by isolation regions formed on the surface of a semiconductor substrate and gate electrodes traversing the active regions. On the semiconductor substrate surface, a field insulating film FOX for element isolation is formed to constitute the isolation regions. The field insulating film FOX may be a silicon oxide film formed through local oxidation of silicon (LOCOS) or shallow trench isolation (STI).

The areas not formed with the field insulating film FOX are active regions AMR and ARL. The active region ARM is a region in which memory elements are formed, and the active region ARL is a region in which logic elements are formed. In FIG. 2A, the active region ARM extends in a horizontal direction and the active region ARL extends in a vertical direction over repetitive units.

After a gate insulating film (such as a silicon oxide film) is formed on the active regions, a polysilicon layer is deposited. By-patterning the gate insulating film and polysilicon layer, gate electrodes G1 and G2, word lines WL also serving as gate electrodes, and a data bus line DB are formed. A salicide process is executed to form silicide layers on the gate electrode and source/drain regions of each transistor in the logic element region.

In FIG. 2A, the word line WL extends in the vertical direction, traversing the active region ARM. In the active region ARL, the separated gate electrode G1 and the gate electrode G2 branched from the data bus line DB along in the vertical direction are formed extending in the horizontal direction. The separated gate electrode G1 extends in the same direction as the memory element active region ARM and forms a contact area of an increased width on the field insulating film FOX.

FIG. 2B shows the layout changed from FIG. 2A by depositing a first insulating film on the substrate with the gate electrodes and the like, forming necessary contact holes through the first insulating film, and forming signal lines of conductive material such as polysilicon on the first insulating film. The signal lines are electrically connected to the underlying active regions at positions indicated by cross marks. A ground line GND and a match line ML extend in the horizontal direction and are connected to the logic element active region ARL at its opposite ends. A bit line BL is formed between the ground line GND and match line ML and connected to ones of the source/drain regions in the memory element active region ARM.

The left area from the bit line contact belongs to the left repetitive unit. Namely, two repetitive units adjacent in the horizontal direction are structured in right/left bilateral symmetry, and a single bit line contact is shared by two repetitive units.

After the signal lines GND, BL and ML are covered with a second insulating film, contact holes are formed through the second insulating film to expose the other source/drain region in the memory element active region and the contact area of the separated gate electrode G1. A capacitor storage electrode SN indicated by a broken line is formed on the second insulating film, the electrode SN filling the inside of the contact holes. The storage electrode SN is connected to the other source/drain region of the memory element transistor and the separated gate electrode G1 of the logic element to electrically connect the other source/drain region and the gate electrode G1. A capacitor dielectric film and an opposing electrode are formed to form the repetitive units U shown in FIG. 1A.

FIG. 2C shows an example of the layout of repetitive units on the substrate plane. Repetitive units $U_{11}$, and $U_{12}$ are structured in right/left bilateral symmetry relative to their border line to form one CAM cell. Repetitive units $U_{13}$ and $U_{14}$ are also structured similarly. The repetitive units $U_{12}$ and $U_{13}$ may have a right/left bilateral symmetry structure or the same structure. The repetitive units $U_{11}$ and $U_{12}$ may have the same structure.

The repetitive units $U_{11}$, $U_{12}$, . . . and repetitive units $U_{21}$, $U_{22}$, . . . are structured in up/down bilateral symmetry relative to their border line. Repetitive units $U_{31}$, $U_{32}$, . . . may have an up/down bilateral symmetry structure or the same structure, relative to the repetitive units $U_{21}$, $U_{22}$, . . . . The repetitive units $U_{11}$, $U_{12}$, . . . and repetitive units $U_{21}$, $U_{22}$, . . . may have the same structure.

FIG. 3 shows the cross sectional structure taken along one-dot chain line III—III shown in FIG. 2B.

In the surface layer of a silicon substrate 1 formed with necessary wells, element separation regions such as trenches are formed, a silicon oxide film is deposited, and thereafter the surface of the substrate is planarized by chemical mechanical polishing (CMP) or the like to form an element separation field insulating region (FOX) 2 of STI. A gate oxide film 3 is formed on the surface of an active region defined by the field insulating region 2. On this gate oxide film 3, a polysilicon film is deposited and patterned to form a gate electrode (including signal lines such as word lines) 5.

After the gate electrode 5 is formed, if necessary, by covering an unnecessary area with a resist pattern, n-type impurities are doped into the semiconductor substrate 1 to form logic element source/drain regions 7 and memory element source/drain regions 8. If different ion implantation are performed, optimum impurity concentrations of the logic element and memory element transistors can be set. It is preferable that the impurity concentration of the logic element source/drain region 7 is set higher, for example one order of magnitude, than that of the memory element source/drain region 8.

A CVD oxide film 11 is formed by chemical vapor deposition (CVD), covering the gate electrode 5. By covering the memory element region with a resist pattern, the CVD oxide film 11 is anisotropically etched to remove the CVD oxide film on the flat surface and leave side spacers 11a on the side walls of the gate electrodes 5. In this state, ion implantation is executed to form source/drain regions 7b of logic element transistors having a high impurity concentration.

The source/drain region 7b of the logic element transistor has an impurity concentration higher than the source/drain region 8 of the memory element transistor.

The resist pattern is removed and a metal layer such as Co capable of silicidation is deposited on the whole surface of the silicon substrate 1. A heat treatment is performed to conduct silicidation between the metal layer and underlying silicon and form silicide layers 25 and 26 on the upper surface of the gate electrode 5 and the surfaces of the high impurity concentration source/drain regions 7b. An unreacted metal layer is removed. A high speed operation of the logic element transistor is easy because of small resistance of the high impurity concentration source/drain regions and the silicide layers. These regions and layers are not formed in the memory element transistor to retain high retention characteristics. A silicidation process may be executed also in the memory cell region to form an inexpensive device with a small number of processes, although the retention characteristics are degraded.

A silicon oxide film 12 providing a planarizing function is formed over the silicon substrate 1, covering the CVD oxide film 11.

Reflow, CMP or the like may be used. After the planarized silicon oxide film 12 is formed, contact holes 13 are formed through the oxide films 12 and 11 by using a resist mask. A conductive film 14 such as polysilicon, tungsten silicide (WSi), or tungsten is deposited on the insulating film 12 and patterned to form ground lines GND (not shown), bit lines BL and match lines ML, the conductive film 14 filling the contact holes.

An insulating film 15 such as borophosphosilicate glass (BPSG) is deposited over the wiring 14, and contact holes 16 for capacitor storage electrode are formed through the insulating films 15, 12 and 11 by using a resist mask. A conductive layer such as polysilicon is deposited on the insulating film 15 formed with the contact holes, and patterned to form a storage electrode 17. The polysilicon is filled in the contact holes 16.

Connection regions CTM and CTL electrically connected together are formed on the bottom surface of the storage electrode 17. The connection region CTM connects the bottom surface of the storage electrode SN to one of the source/drain regions 8 of the memory element. The connection region CTL connects the bottom surface of the storage electrode SN to the gate electrode 5 (G1) of the logical element. A capacitor dielectric film 18 is formed on the whole substrate surface and a cell plate (opposing) electrode 19 is formed thereon.

In the above manner, the repetitive units U are formed. Other repetitive units can be formed having the same structure or the bilateral symmetry structure.

FIGS. 4A to 4E are cross sectional views illustrating the manufacture processes for the semiconductor device shown in FIG. 3.

Figure 4A:
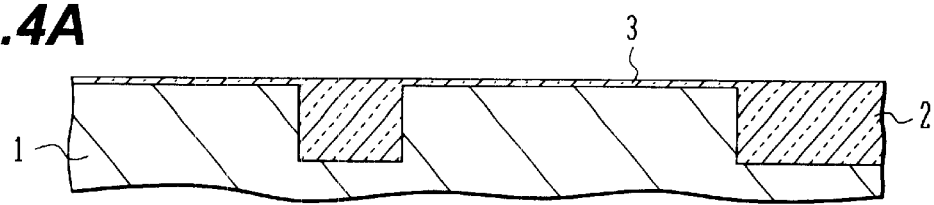
FIGS. 4A to 4F are cross sectional views of a semiconductor substrate illustrating the processes of manufacturing the structure shown in FIG. 3.

As shown in FIG. 4A, on the surface of a silicon substrate 1, a field insulating film (FOX) 2 for element separation is formed. For example, the field oxide film is formed by forming a silicon nitride film pattern on a buffer oxide film in an area corresponding to the active regions and then performing local oxidation of silicon (LOCOS). Alternatively, shallow trench isolation (STI) may be used. In this case, a resist pattern is formed on the silicon substrate 1, and element separation trenches are formed through etching. Next, a silicon oxide film is deposited filling the trenches, and the surface is planarized by CMP or the like.

After the field insulating film 2 is formed, impurity ions are implanted for n- and p-type well formation and transistor threshold value adjustment when necessary. Different ion implantation may be executed by separating the memory element region and logic element region with resist patterns. In this case, it is preferable to execute the ion implantation so that the off-characteristics of memory elements can be improved and the operation speed of logic elements can be raised. After the ion implantation for threshold value adjustment, a gate oxide film 3 is formed through thermal oxidation or the like in the active region with exposed silicon surface defined by the field insulating film 2.

Figure 4B:
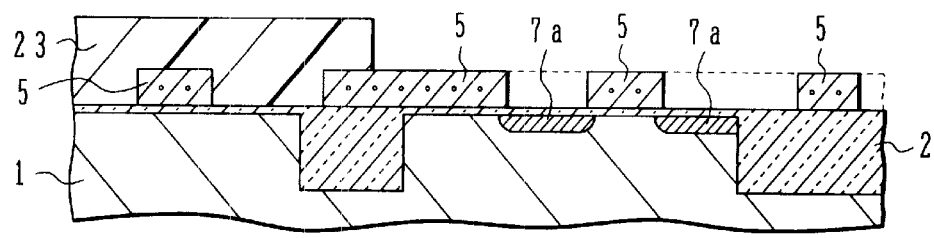

As shown in FIG. 4B, a conductive film such as polysilicon is deposited over the whole surface of the semiconductor substrate. If a CMOS structure is to be incorporated, by using a resist mask having an opening corresponding to the area where an n-channel MOS transistor is formed, n-type impurity ions P are implanted, and by using a resist mask having an opening corresponding to the area where a p-channel MOS transistor is formed, p-type impurity ions B are implanted. With these ion implantations, the gate electrode of an n-channel MOS transistor becomes an n-type to form a surface channel MOS transistor, and that of a p-channel MOS transistor becomes a p-type to form a surface channel MOS transistor.

Thereafter, by using a resist mask formed on the conductive film, the conductive film is patterned to form a gate electrode (including signal lines) 5.

Next, by using a resist mask 23 covering the memory element region and logic p-MOS region, n-type impurity ions As are implanted into the logic element region at an acceleration energy of 10 keV and at a dose of $5 \times 10^{14} cm^{-2}$. Then, covering the memory element region and the logic n-MOS region with a resist mask, p-type impurity ions B are implanted to the logic region at 5 keV and at a dose of $3 \times 10^{14} cm^{-2}$. With these ion implantations, source/drain regions 7a of the logic element in a CAM region are formed.

Figure 4C:
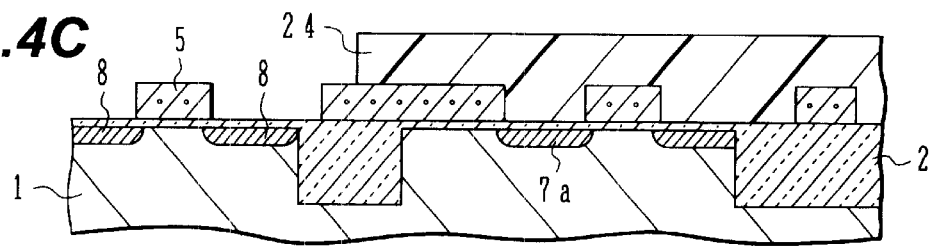

As shown in FIG. 4C, a resist mask covering the logic element region is formed on the surface of the semiconductor substrate. By using this resist mask 24, n-type impurity ions P are implanted into the memory element region at an acceleration energy of 30 keV and at a dose of $3 \times 10^{13} cm^{-2}$ to form source/drain regions 8 on both sides of the gate electrode 5.

Figure 4D:
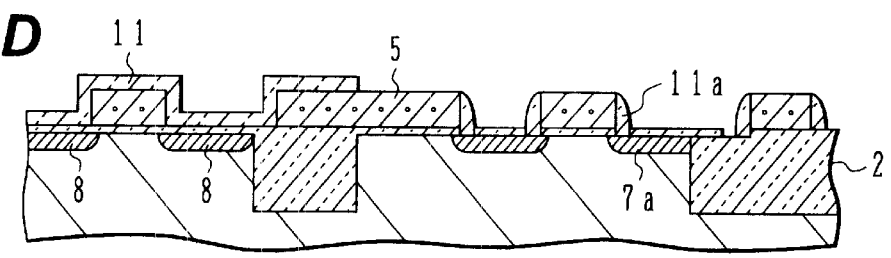

As shown in FIG. 4D, a silicon oxide film 11 is deposited by chemical vapor deposition (CVD) over the whole surface of the silicon substrate, covering the gate electrode 5. In place of the oxide film, a nitride film or a lamination of an oxide film and a nitride film may be formed. By covering the memory element region with a resist mask, the silicon oxide film 11 in the logic element region is anisotropically etched to remove the silicon oxide film 11 on the flat surface and leave silicon oxide films 11a only on the side walls of the gate electrode 5. This silicon oxide film 11a is the side wall oxide film of the gate electrode 5.

Figure 4E:
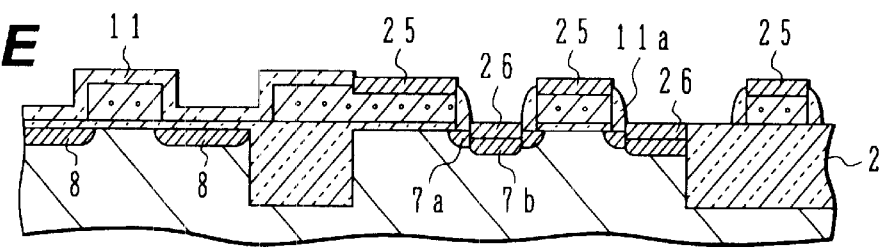

As shown in FIG. 4E, ion implantation is executed to form source/drain regions 7b in the logic element region having a high impurity concentration. If a CMOS circuit is to be formed, the ion implantation is executed by using a resist mask having an opening exposing each n-channel transistor in the logic element region. The resist mask is removed thereafter. Ion implantation is also done to p-MOS regions in a similar way.

Ion implantations are controlled so that the impurity concentration of the source/drain regions 8 of the MOS transistor in the memory element region is lower than that of the source/drain regions 7b of the MOS transistor in the logic element region, and the acceleration energy of ion implantation higher than that in the logic region. With this impurity concentration and depth control, the retention characteristics of the memory element can be improved and the operation speed of the logic element can be raised. Ion implantations illustrated with FIGS. 4B and 4C may be performed by the same process.

A Co film is formed over the whole surface of the silicon substrate by sputtering. A silicidation process is executed through rapid thermal annealing (RTA) to form silicide layers 25 and 26. An unreacted Co film is removed by using aqua regia.

Figure 4F:
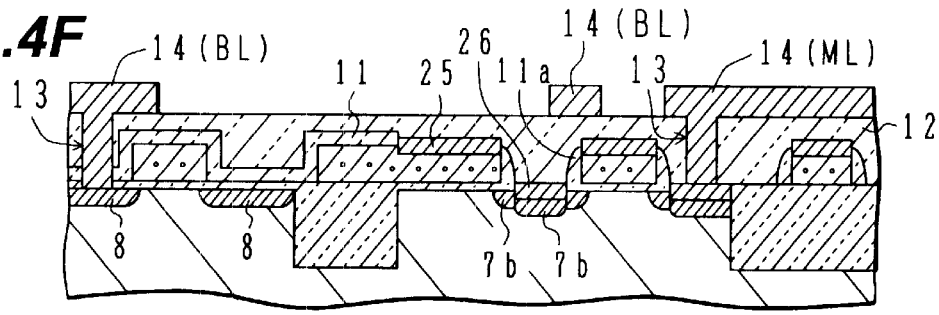

As shown in FIG. 4F, a silicon oxide film 12 having a planarizing function is formed over the silicon substrate 1, covering the oxide film 11. For example, a borophosphosilicate glass (BPSG) film or a silicon oxide film using tetraethoxysilane (TEOS) is deposited.

Reflow or CMP may be used for surface planarization. The two-layer structure of the interlevel insulating film may be changed to a three-layer structure. In this case, in place of two silicon oxide films, a lamination of a silicon oxide film, a silicon nitride film and a silicon oxide film or other films may be used.

As shown in FIG. 4F, by using a resist mask, contact holes 13 are formed through the silicon oxide films 12 and 11. A conductive film is grown to form a wiring layer, filling or partially occupying the contact holes. The conductive film may be a P-doped polysilicon film, a WSi film or W film or the like. Thereafter, a resist mask is formed on the wiring layer, and the wiring layer is patterned to form wiring patterns 14. A wiring pattern 14 shown on the left side of FIG. 4F is a bit line BL, and a wiring pattern 14 shown on the right side is a match line ML. The wiring layer may be a single-layer such as a polysilicon film, a lamination layer of three layers such as a Ti layer, a TiN layer and a W layer, or a lamination layer of four or more layers. The material of the wiring layer may be any material if it gives a desired conductivity and the like.

Thereafter, an insulating film 15 (FIG. 3) is formed on the insulating film 12, covering the wiring 14. After contact holes for the capacitor are formed, a conductive film such as polysilicon is deposited on the insulating film 15 and patterned to form a storage electrode and connection terminals. Thereafter, a capacitor dielectric film and a cell plate electrode are formed to complete a CAM cell.

In the structure shown in FIGS. 2A and 2B, the contact holes are formed for one of the source/drain regions of the memory element and for one of the gate electrodes of the logic element. This structure of two contact holes may be replaced by the structure of one contact hole.

Figure 5:
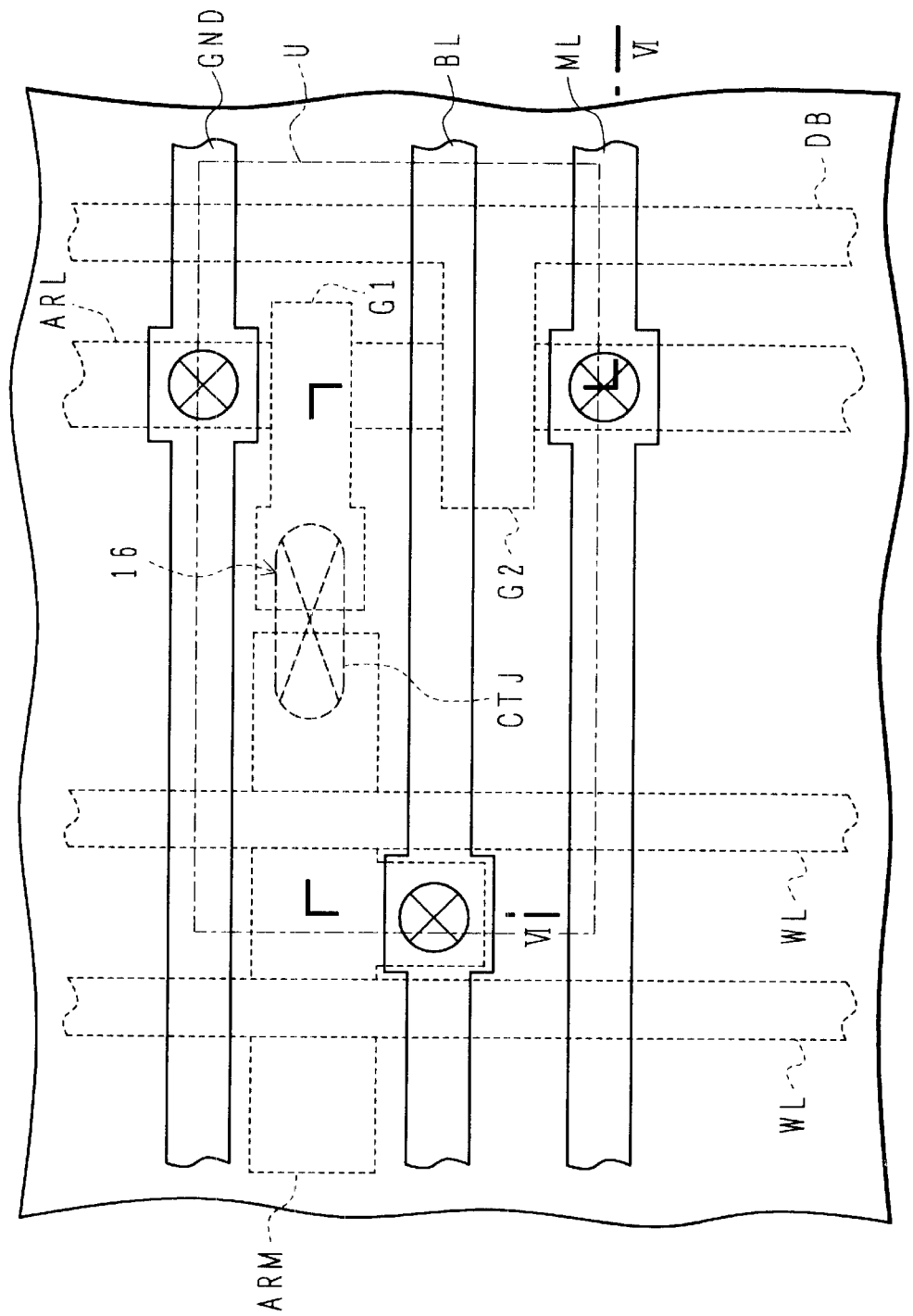
FIG. 5 is a plan view showing the structure of CAM according to another embodiment of the invention.

FIG. 5 shows the structure that one contact hole connects one of the source/drain regions of the memory element and one of the gate electrodes of the logic element. A contact hole 16 is formed through the insulating film in such a manner that the contact hole covers the end portion of the active region ARM of the memory element and the contact portion of the gate electrode G1 of the logic element. A connection terminal CTJ is filled in the contact hole 16. The connection terminal CTJ electrically connects one of the source/drain regions of the memory element, a storage electrode, and one of the gate electrodes G1 of the logic element. The other structures are similar to those shown in FIGS. 2A and 2B.

Figure 6:
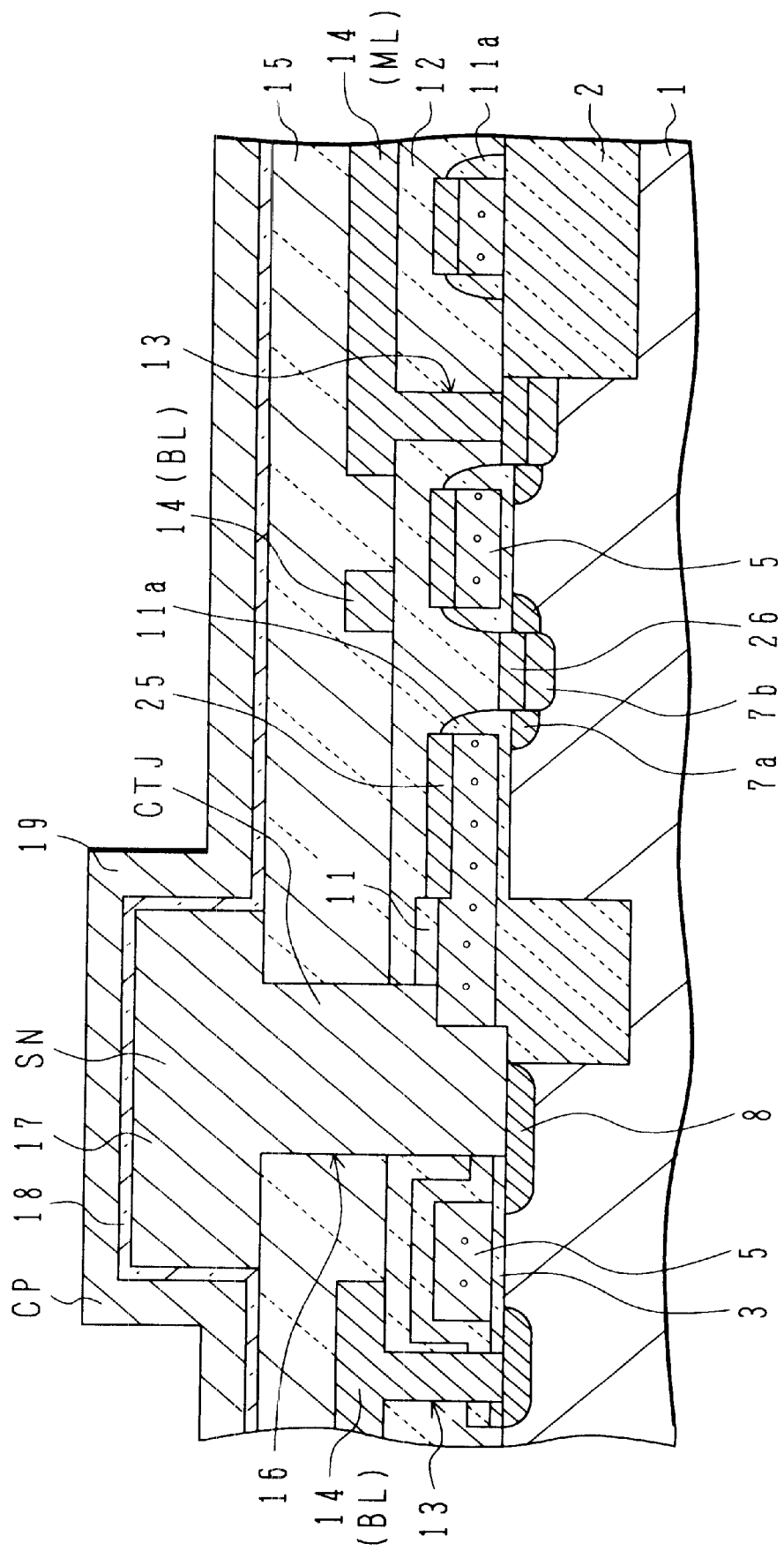
FIG. 6 is a cross sectional view showing the structure of CAM shown in FIG. 5.

FIG. 6 shows the cross sectional structure taken along line XI—XI shown in FIG. 5. The contact hole 16 functions as the two contact holes 16 shown in FIG. 3, and has a broader cross sectional area. One of the source/drain regions 8 of the memory element and the gate electrode G1 of the logic element are exposed at the bottom of the contact hole 16. The connection terminal CTJ is formed filling the contact hole 16 and electrically connects one of the source/drain regions 8 and the gate electrode G1. The other structures are similar to those shown in FIG. 3.

Figure 7:
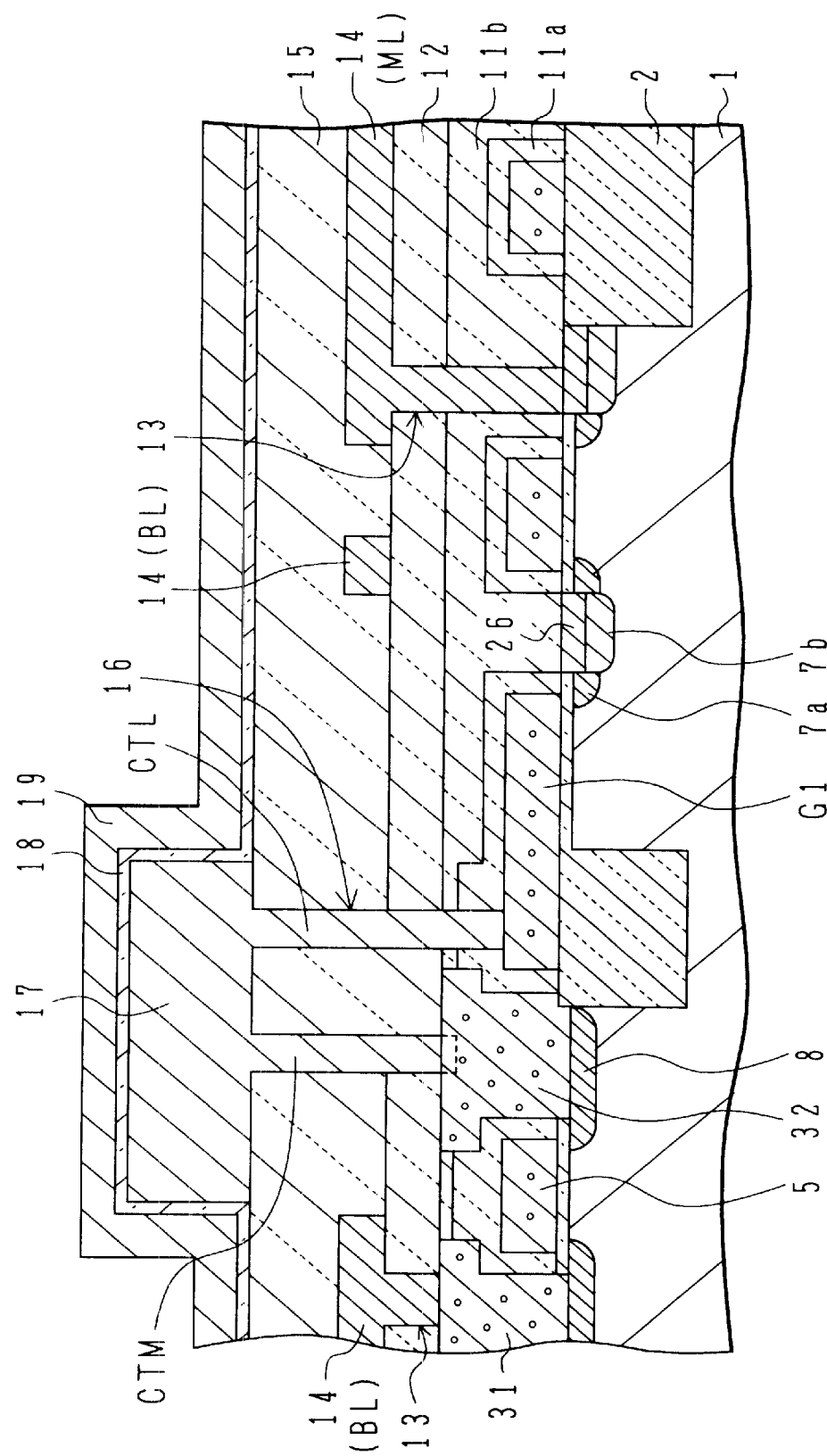
FIG. 7 is a cross sectional view showing the structure of a semiconductor device according to another embodiment.

FIG. 7 shows the structure of the connection terminal partially using plugs. Although a silicide layer is formed on the source/drain regions of a logical element MOS transistor, it is not formed on the gate electrode.

As shown, similar to the embodiments described above, a field insulating film 2 and a gate insulating film 3 are formed on a semiconductor substrate 1. A gate electrode 5 is formed on the gate insulating film 3, the upper and side surfaces of the gate electrode 5 being covered with a silicon nitride film 11a. A silicon oxide film 11b is formed over the substrate, covering the silicon nitride film. The silicon nitride film 11a and silicon oxide film 11b are collectively called a first insulating film 11.

Contact holes are formed through the first insulating film 11 in areas above the source/drain regions of the memory element, exposing the silicon nitride film on the side walls of the gate electrode. Conductive plugs 31 and 32 of, for example, polysilicon or tungsten, are filled in these contact holes.

In the logic element region, the source/drain regions 7 of the logic element transistor have the LDD structure with low impurity concentration regions 7a and high impurity regions 7b, and a silicide layer 26 formed on the region 7b. In order to form the LDD structure, the silicon nitride film 11a forms the side spacers on the side walls of the gate electrode 5 and a portion thereof on the source/drain regions is removed.

More specifically, a silicon nitride film having the same shape as the gate electrode is formed in advance on the upper surface of the gate electrode. Therefore, even if the silicon nitride film on the flat surface is anisotropically etched to form the side spacers and the source/drain regions are exposed, the silicon nitride film is left on the upper surface of the gate electrode. Namely, the upper and side surfaces of the gate electrode are covered with the silicon nitride film. This anisotropic etching etches the insulating film 11a in the logic element region, and the thickness thereof is less than that of the insulating film 11a in the memory element region.

In this state, a salicide process is executed to form a silicide layer on the high concentration source/drain regions of a logic element transistor. Since the gate electrode 5 is covered with a silicon nitride film 12a, a silicide layer is not formed on the gate electrode. After the silicidation process, a silicon oxide film 11b is formed over the surface of the silicon substrate 1, covering the silicon nitride film 11a.

Contact holes are formed through the first insulating film 11 at the positions corresponding to the source/drain regions 8 of a memory element. The contact holes may expose the silicon nitride film on the side walls of the gate electrodes. Conductive plugs 31 and 32 made of, for example, polysilicon, are filled in the contact holes.

A second insulting film 12 is deposited on the first insulating film 11 and the plugs 31 and 32. A contact hole 13 in memory region is formed reaching the plug 31 and a contact hole 13 is formed reaching one of the source/drain regions 7 of the logic element. A conductive film 14 is formed on the surface of the second insulating film 12, at least partially filling the contact holes, and a bit line BL and a match line ML (14) are formed by usual photolithography process.

A third insulating film 15 is formed over the substrate, covering the wiring 14. Contact holes 16 are formed from the surface of the third insulating film 15 to the plug 32 of one of the source/drain regions 8 of the memory element and to the separated gate electrode G1 of the logic element. A conductive film 17 is formed filling the contact holes 16. A storage electrode SN, and connection terminals CTM and CTL are formed by usual photolithography process. A capacitor dielectric film 18 and a cell plate electrode 19 are formed covering the storage electrode to form a CAM cell.

The conductive layer 17 forming the storage node SN of the capacitor is sufficient in the memory element region if it reaches the upper surface of the plug 32, so that the connection terminals can be formed more reliably. The upper surface of the plug 32 may be formed with a trench indicated by a broken line during the contact hole etching process.

Similar to the structure shown in FIG. 5, one connection terminal may be used, also in the case of using a plug, for connecting one of the source/drain regions of the memory element 8 and the gate electrode G1 of the logic element.

Figure 8:
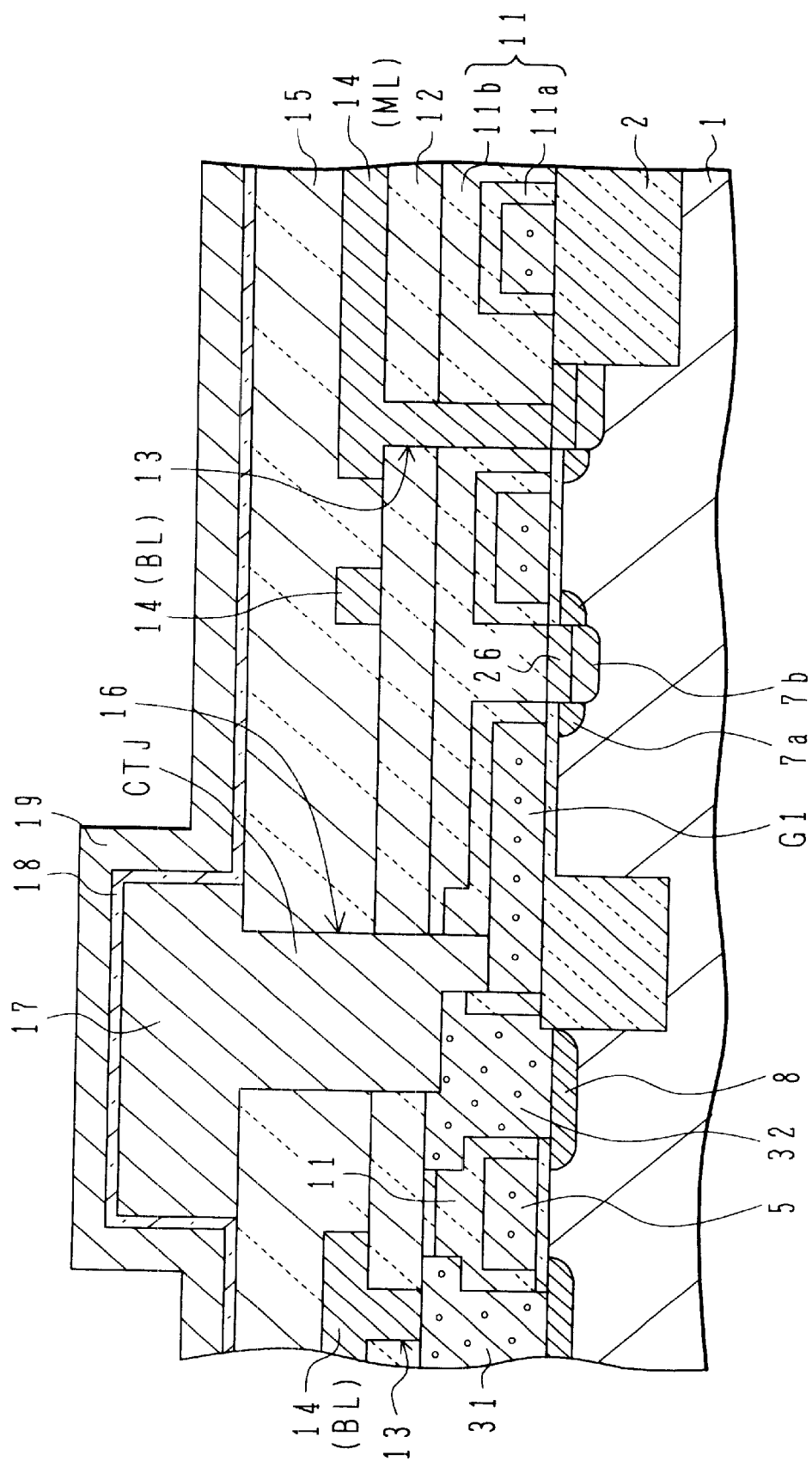
FIG. 8 is a cross sectional view showing the structure of a semiconductor device according to still another embodiment.

FIG. 8 shows the structure of such connection. Plugs 31 and 32 have the same structure as that of the embodiment shown in FIG. 7. The upper surface of the plug 32 may have a step formed by an etching process to form CTJ contact hole. A contact hole covering both the plug 32 and gate electrode G1 is formed and a connection terminal CTJ is formed filling the contact hole. This common connection terminal CTJ electrically connects a storage electrode 17, plug 32 and gate electrode G1. The other structures are similar to those shown in FIG. 7.

FIGS. 9A to 9E illustrate the processes of manufacturing a CAM structure shown in FIGS. 7 and 8. The manufacture processes for the CAM structure shown in FIG. 8 will be described.

Figure 9A:
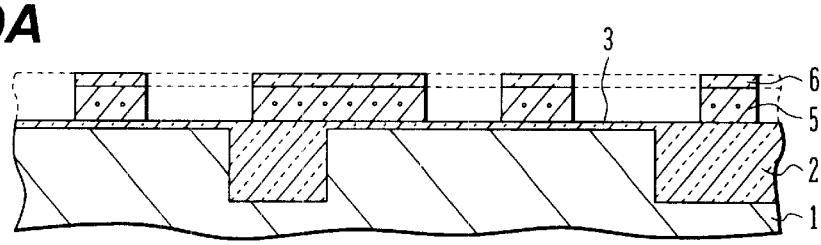
FIGS. 9A to 9E are cross sectional views of a semiconductor substrate illustrating the processes of manufacturing the structure shown in FIG. 8.

As shown in FIG. 9A, similar to the embodiment described above, on the surface of a silicon substrate 1, a field insulating film 2 and a gate oxide film 3 are formed.

After the gate oxide film 3 is formed, a lamination layer of a polysilicon film 5 and a silicon nitride film 6 is formed over the silicon substrate surface. The film 5 may be replaced with a lamination layer of poly Si and WSi, and the silicon nitride film may be replaced with an $SiO_2$ film. A resist mask is formed on the surface of the silicon nitride film 6 to pattern the polysilicon film 5 and a silicon nitride film 6 in the same shape. Thereafter, the resist mask is removed.

Figure 9B:
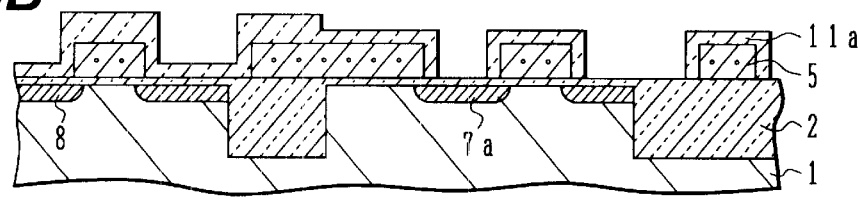

As shown in FIG. 9B, different ion implantations are executed for the memory element region and logic element region by using resist masks. The low impurity concentration source/drain regions 7a in the logic element region and the source/drain regions 8 in the memory element region are therefore formed. Thereafter, a silicon nitride film 11a is deposited over the surface of the silicon substrate, and an anisotropic etching is performed by covering the memory element region with a resist mask.

In the logic element region, the silicon nitride film 11a on the source/drain regions 7 is removed to leave side spacers on the side walls of the gate electrode 5. The silicon nitride film 11a is integrated with the underlying silicon nitride film 6, and the upper and side surfaces of the gate electrode are covered with the silicon nitride film. For convenience of drawing, these silicon nitride films 6 and 11a are collectively represented by 11a. A step is formed on the silicon nitride film 11a at the border between the logic element region and memory element region, the height of the step corresponding to the etch amount by the anisotropic etching.

Figure 9C:
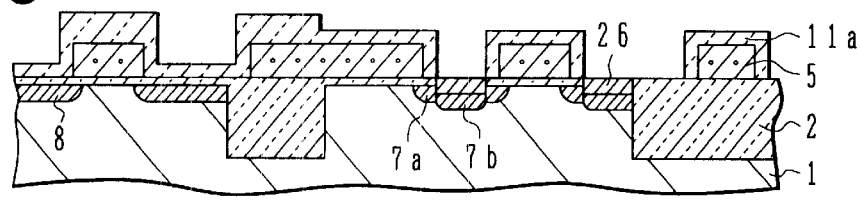

As shown in FIG. 9C, in the logic element region with the side spacers, n-type impurity ions such as As ions are further implanted. If a CMOS structure is to be incorporated, different ion implantations are executed for the n-channel MOS region and p-channel MOS region by using resist masks. Thereafter, the resist mask is removed. The source/drain regions having the LDD structure are therefore formed in the logic element region, having a higher impurity concentration than that of the source/drain regions in the memory element region. The source/drain regions 8 of the memory element region are maintained at a low impurity concentration so that the retention characteristic of the memory can be maintained high.

After the high impurity concentration source/drain regions are formed, a Co film is formed over the silicon substrate 1 by sputtering. A heat treatment by RTA is executed to form silicide layers 26 through silicidation between the Co film and exposed silicon. An unreacted Co film is removed by using aqua regia.

Figure 9D:
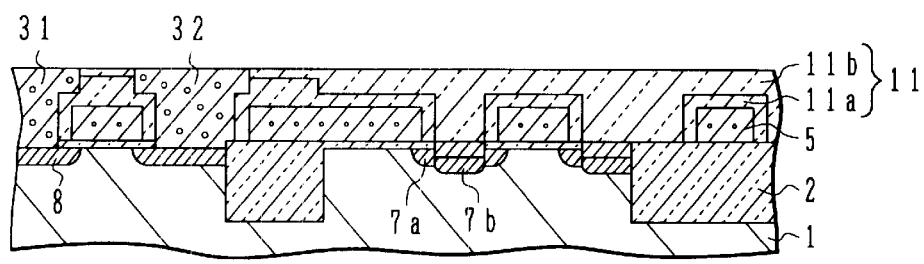

As shown in FIG. 9D, another insulating film 11b is formed over the silicon substrate surface. For example, a lamination layer of a silicon nitride film and a BPSG film is formed and a reflow process is performed to planarize the surface of the insulating film. Instead of the silicon nitride film, a CVD silicon oxide film, a lamination layer such as a lamination layer of a silicon oxide film and a silicon nitride film may also be used. Instead of the reflow process or after the reflow, CMP may be executed for surface planarization.

A resist mask is formed on the insulating film 11b, and contact holes exposing the source/drain regions 8 of the memory element region are formed. In this contact hole forming process, the silicon nitride film covering the gate electrode realizes a self-alignment contact hole forming process. Thereafter, the resist mask is removed, and a polysilicon film doped with n-type impurities such as P is deposited. This conductive film on the insulating film 11b is removed by CMP to form plugs 31 and 32.

Figure 9E:
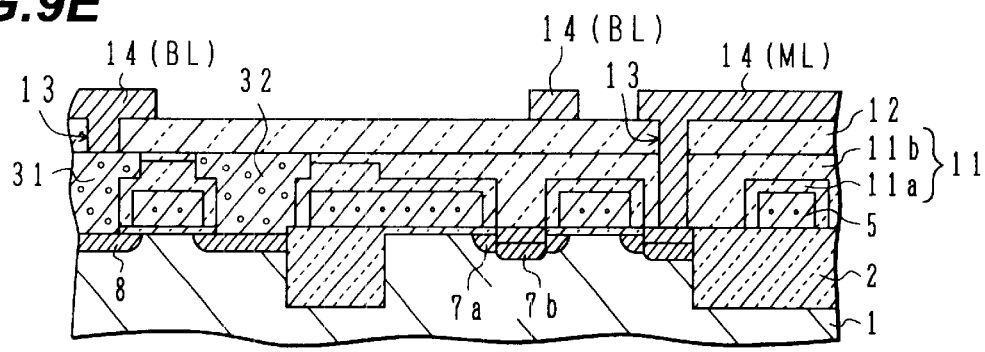

As shown in FIG. 9E, an insulating film 12 such as a silicon oxide film is formed on the insulating film 11b, and contact holes 13 are formed by using a resist mask. A polysilicon film, a lamination film of a polysilicon film and a WSi film or the like is formed on the insulating film 12 with the contact holes and patterned by using a resist mask to form wiring layers 14.

An interlevel insulating film 15 (FIGS. 7 and 8) such as a silicon oxide film and a BPSG film is deposited and reflowed to planarize the surface thereof. CMP may be executed thereafter. Contact holes are formed by using a resist mask. Depending upon the shape of the resist mask, the structure shown in FIG. 7 or FIG. 8 can be formed selectively.

A polysilicon layer is deposited filling the contact holes. The polysilicon film is patterned to form a storage electrode SN and connection terminals CT (CTM, CTL, CTJ). Subsequently, a capacitor dielectric film 18 and a polysilicon film 19 are deposited and patterned to form the storage capacitor structure. If necessary, an insulating film such as BPSG is formed, reflowed and planarized by CMP, contact holes are formed, and a wiring layer is formed to complete CAM.

The structure of the repetitive unit of CAM is not limited to those shown in FIG. 2B and FIG. 5.

Figure 10:
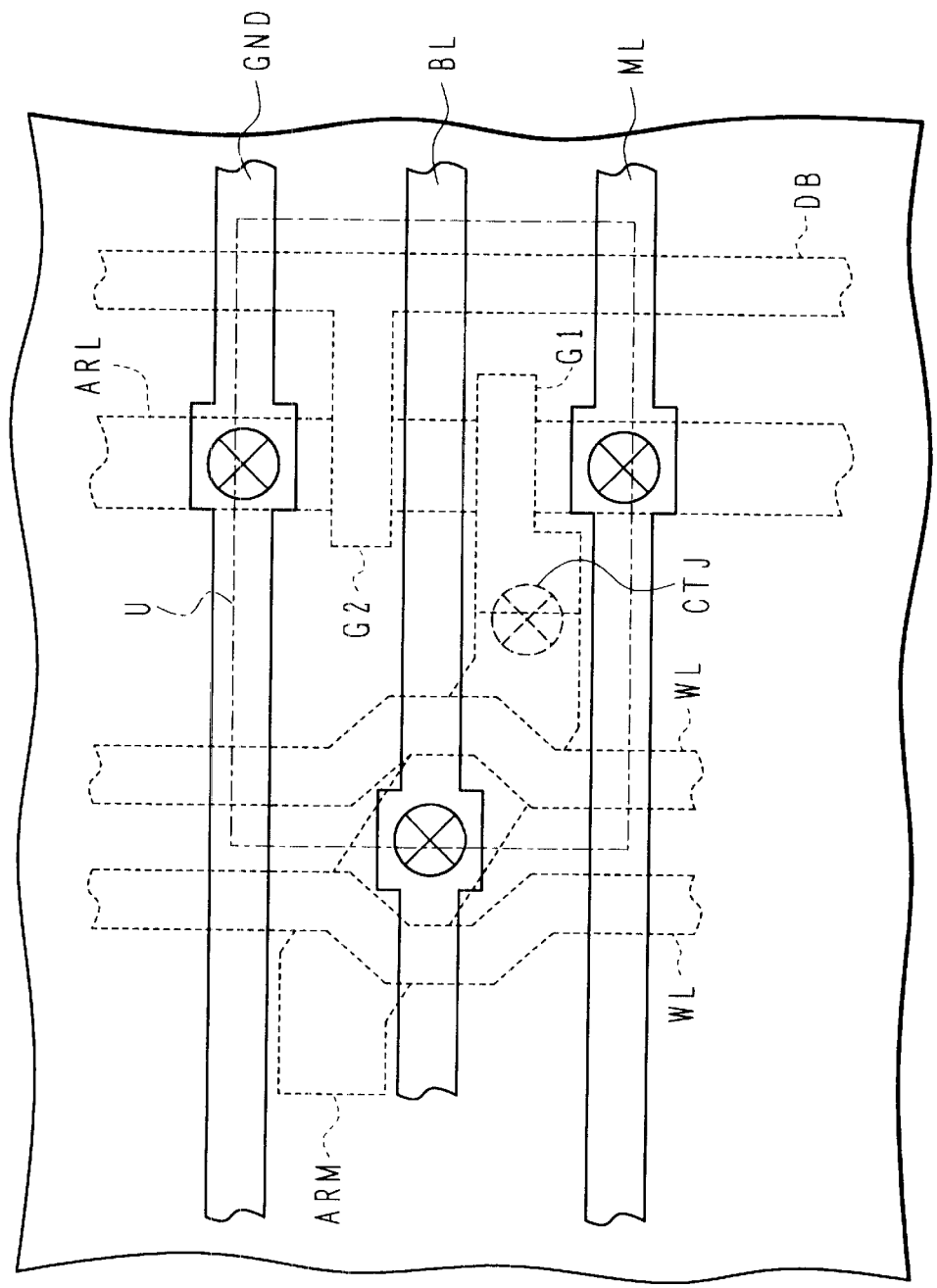
FIG. 10 is a plan view showing another example of the structure of CAM.

FIG. 10 shows a modification of the layout of CAM. As compared with the structure shown in FIG. 2B, the position of the separated gate electrode G1 of the logic element is exchanged by the position of the gate electrode G2 connected to the data bus line DB. The equivalent circuit is shown in FIG. 1C. The word lines WL are curved to surround the bit line contact. The active region ARM of the memory region includes opposite areas in parallel to the signal lines GND, BL and ML and an oblique area between the opposite areas. It is preferable that the active region is generally perpendicular to the word lines WL.

Similar to the embodiment shown in FIG. 5, one of the source/drain regions in the active region ARM and the separated gate electrode G1 of the logic element are connected by the connection terminal CTJ formed in one contact hole. The other structures are similar to those shown in FIG. 2B.

Figure 11B:
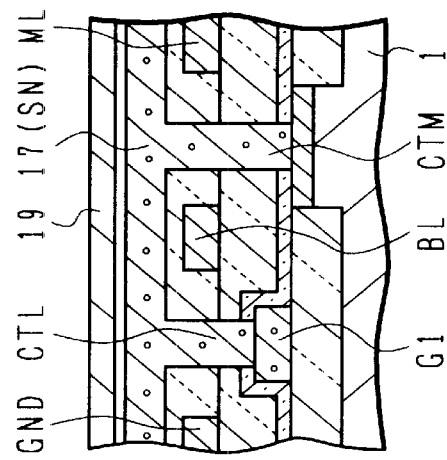
FIGS. 11A and 11B are a plan view and a cross-section showing another example of the structure of CAM.
Figure 11A:
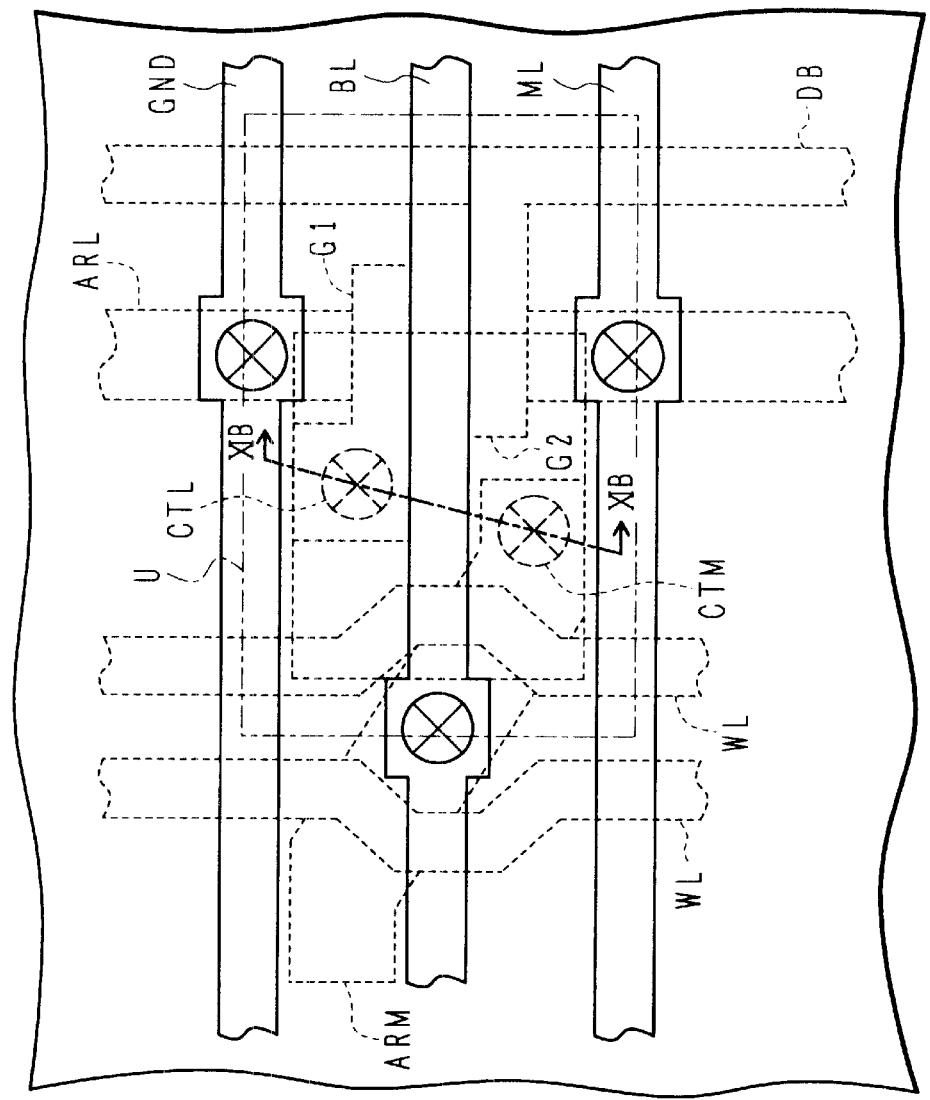

FIGS. 11A and 11B show another modification. FIG. 11A shows a plan layout, and FIG. 11b shows the cross sectional structure. Similar to the modification shown in FIG. 10, the active region ARM of the memory element has a deflected shape, and the word lines WL have a curved shape to surround the bit line contact area. The separated gate electrode G1 in the logic element region is disposed between the ground line GND and bit line BL. The gate electrode G2 connected to the data bus line DB is disposed between the bit line BL and match line ML.

The contact area of the gate electrode G1 is disposed between the bit line BL and ground line GND, in the upper area of the right end portion of the memory element active region ARM as viewed in FIG. 11A, and passing over the bit line BL. Since the right end portion of the memory element active region ARM and the separated gate electrode G1 are disposed in different areas, the lateral size as viewed in FIG. 11A can be utilized effectively. The layout of the separated gate electrode G1 and the gate electrode G2 connected to the data bus line DB is similar to that shown in FIG. 2B. The equivalent circuit is shown in FIG. 1A.

As shown in FIGS. 11A and 11B, the connection terminal CTM of the memory element and the connection terminal CTL of the logic element are disposed on opposite sides of the bit line BL and in the vertical direction as viewed in FIG. 11A. The other structures are similar to those shown in FIG. 2B and FIG. 10.

Figure 12:
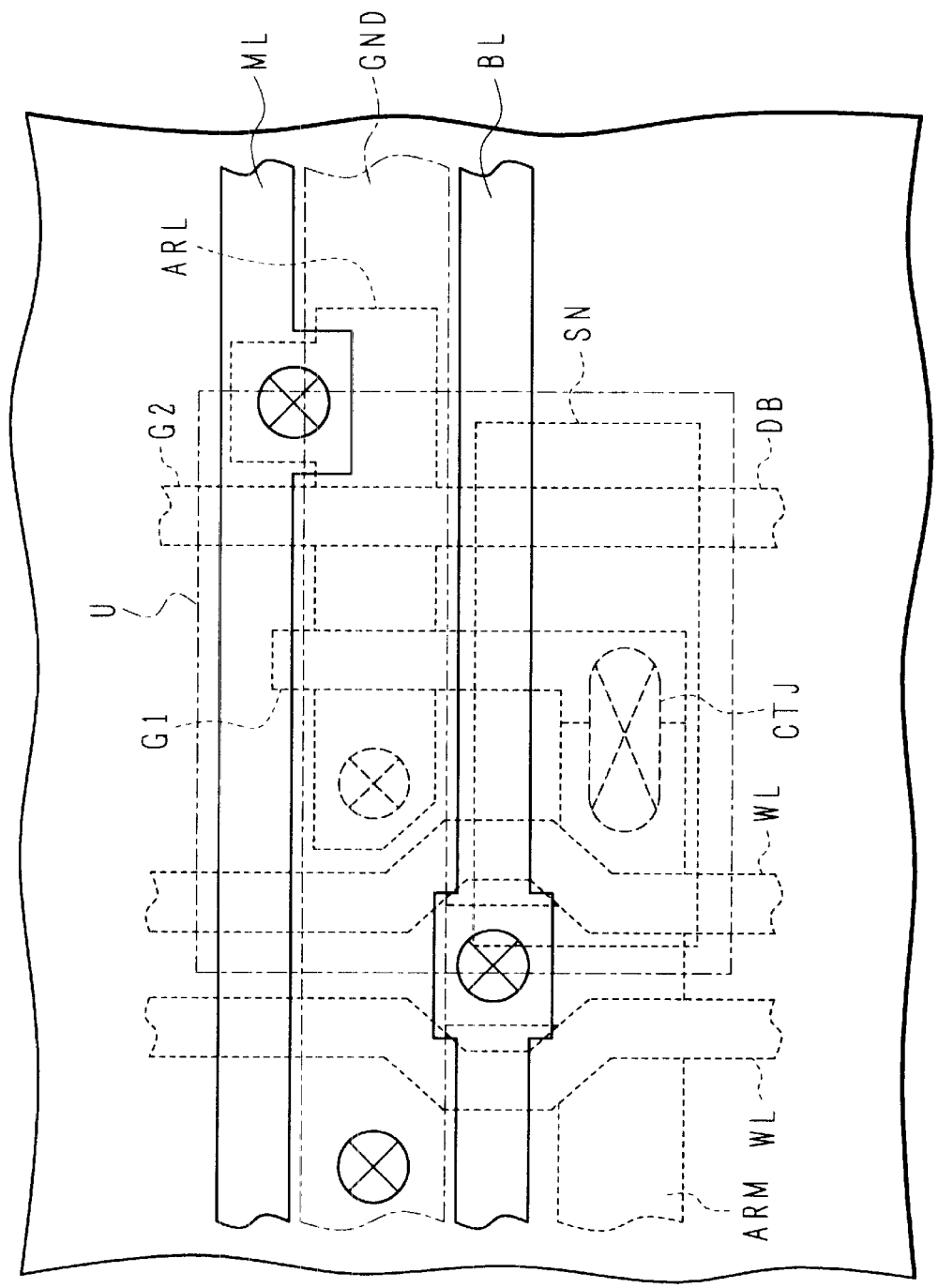
FIG. 12 is a plan view showing another example of the structure of CAM.

FIG. 12 shows another example of the layout. In this example, the active region ARM of the memory element and the active region ARL of the logic element both have the shape extending in the lateral direction, and have the contact area projecting upward.

The word line WL serving also as the gate electrode of the memory element, separated gate electrode G1 of the logic element, and data bus line DB serving also as the gate electrode G2 all have the shape extending in the vertical direction. The word lines WL have a curved shape to surround the bit line contact area.

The bit line BL and match line ML are formed extending in the lateral direction, by using the same wiring layer above the gate electrodes. By using the higher level wiring layer, the storage electrode SN and ground line GND are formed. One of the source/drain regions of the memory element and the separated gate electrode G1 of the logic element are connected by a single connection terminal CTJ. Although the ground line GND extends in the lateral direction, it may extend in the vertical direction. The equivalent circuit is shown in FIG. 1A.

Figure 13:
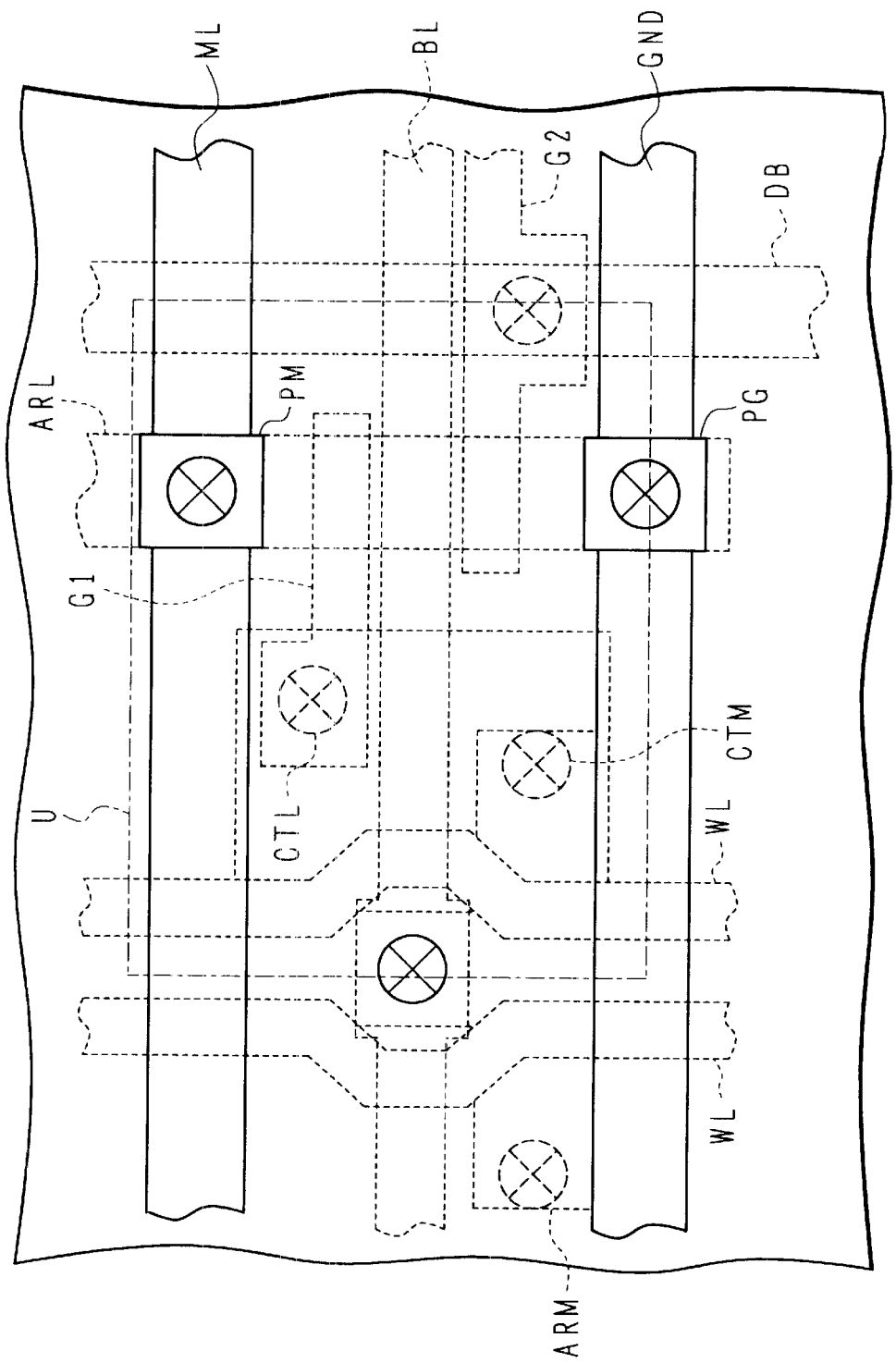
FIG. 13 is a plan view showing another example of the structure of CAM.

FIG. 13 shows another example of the layout. In this example, the active region ARM of the memory element extends in the lateral direction and its contact portion projects upward. The active region ARL of the logic element extends in the vertical direction. The word lines WL in the memory element region have a curved shape to surround the bit line contact in the bit line contact area.

The gate electrode in the logic element region extends in the lateral direction. The data bus line DB is formed by the wiring layer above the gate electrode. The contact areas between one of the source/drain regions of the memory element region and the separated gate electrode G1 of the logic element region are disposed on opposite areas of the bit line in the vertical direction. The equivalent circuit is shown in FIG. 1C. The match line ML and ground line GND are formed by using the wiring layer different from the wring layer of the bit line BL. In this case, the plugs PM and PG are formed in the contact area by using the same wiring layer as the data bus line DB. With this structure, the wiring layer of the logic circuit has a low resistance enhancing a high speed operation.

Figure 14:
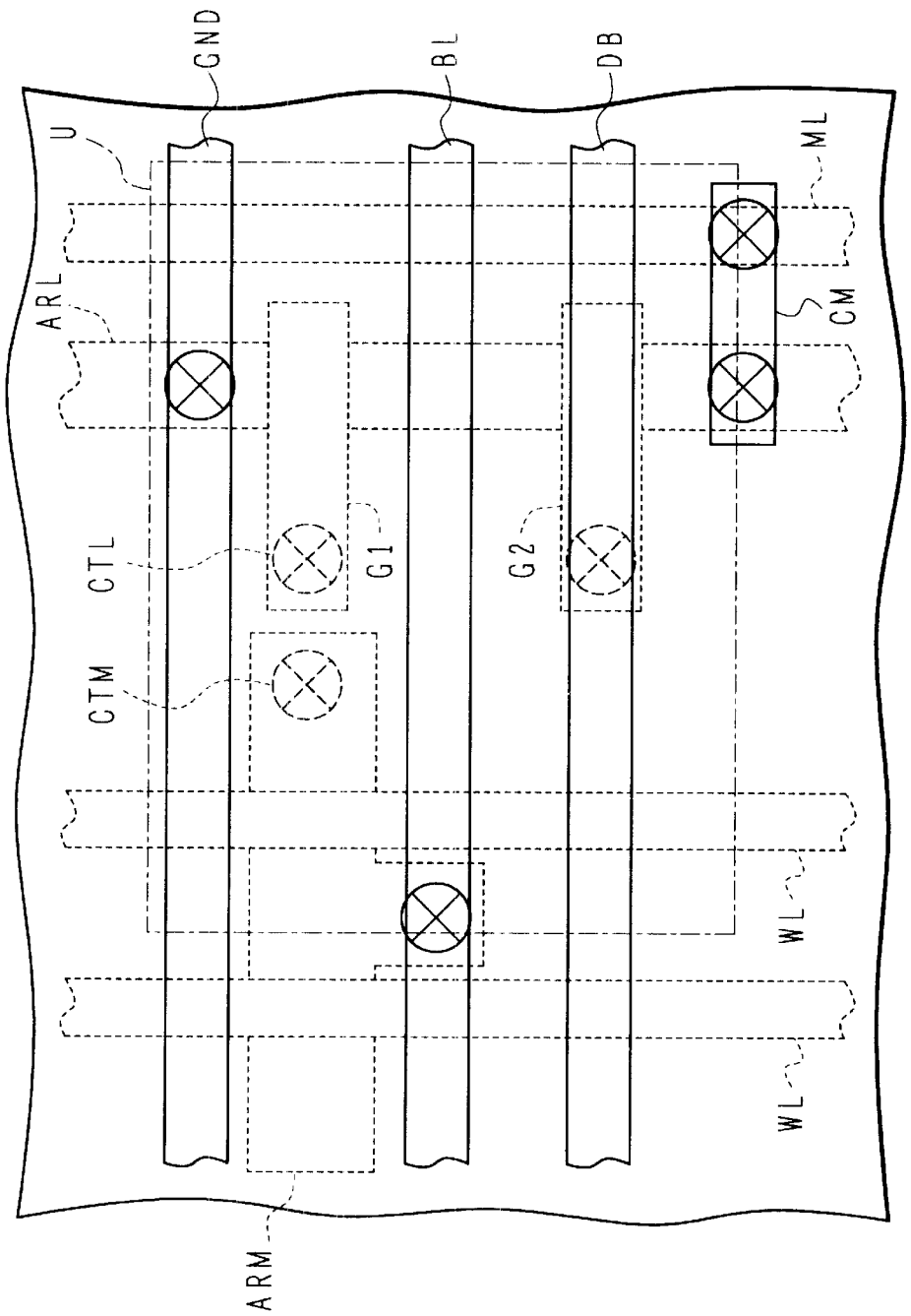
FIG. 14 is a plan view showing another example of the structure of CAM.

FIG. 14 shows another example of the layout. In this example, although the active region ARM of the memory element and the active region ARL of the logic element have the same layout as that shown in FIG. 13, their relative position is different. The memory element active region ARM extends in the lateral direction in the left area as viewed in FIG. 14 and has a downward projection. The word lines WL extend straightforward in the vertical direction.

The separated gate electrode G1 and the gate electrode G2 connected to the upper layer data bus DB line via the contact hole extend in the lateral direction, crossing the logic element active region ARL extending in the vertical direction.

The data bus line DB is formed by the same upper level conductive layer of the ground line GND and bit line BL. These signal lines GND, BL and DB extend in the lateral direction. The match line ML is formed by using the same conductive layer as the gate electrode, and extends in the vertical direction in parallel to the word lines WL. The match line ML is connected to one of the source/drain regions of the logic element region by the connection terminal CM formed by the same conductive layer as the layer of the signal lines GND, BL and DB.

As compared with the layout shown in FIG. 13, the positions of the data bus line DB and match line ML are exchanged. The structures of the connection terminals CTM and CTL via the storage electrode are similar to those shown in FIG. 2B.

Figure 15:
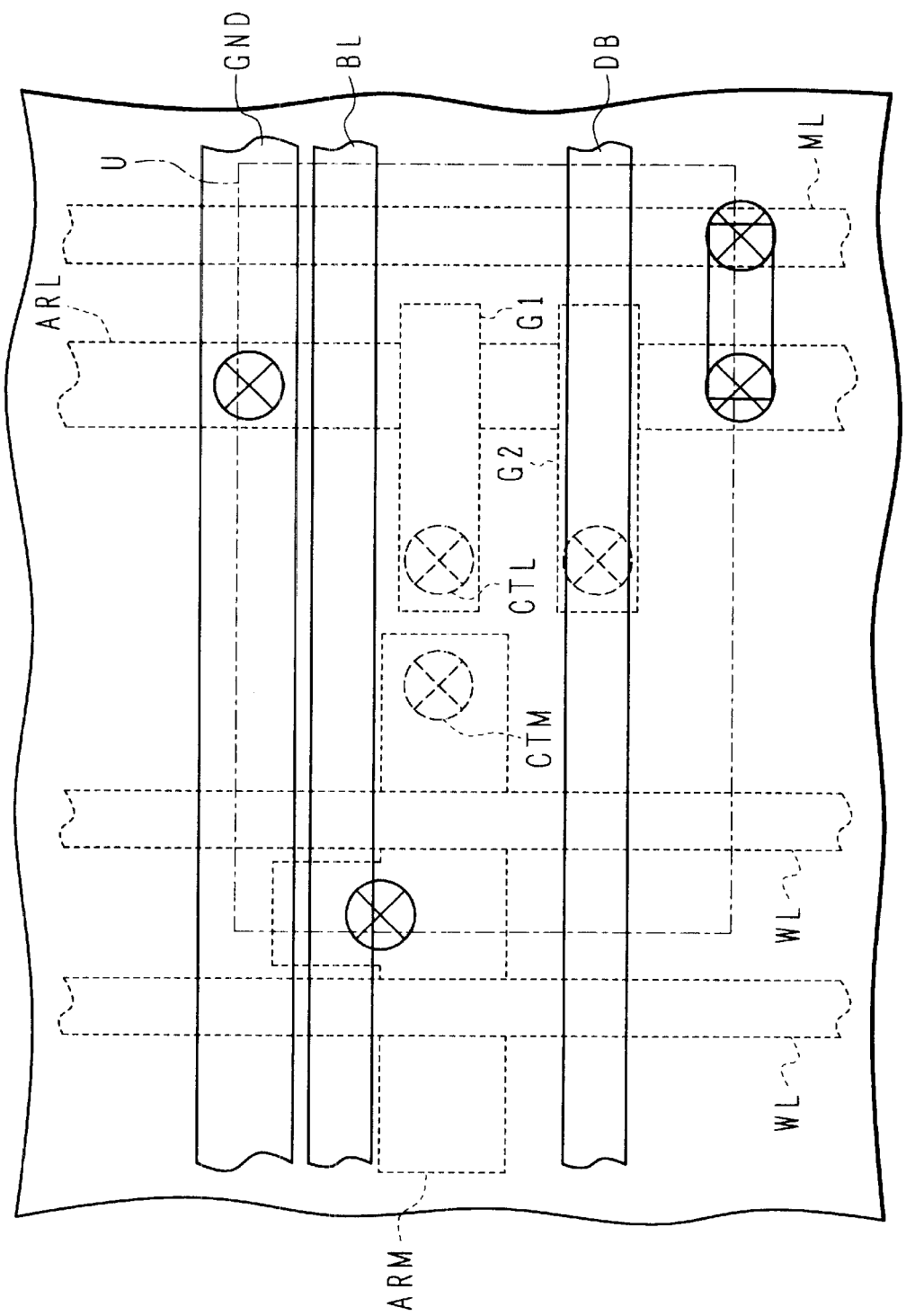
FIG. 15 is a plan view showing another example of the structure of CAM.

FIG. 15 shows another example of the layout. In this example, the bit line contact area of the memory element active region ARM is formed projecting upward, and the bit line BL is disposed just below the right of the ground line GND. As compared with the layout shown in FIG. 14, the bit line BL is moved above the memory element active region ARM. Therefore, the contact hole for the memory element active region ARM is also moved upward.

FIGS. 16A to 24B illustrate manufacture processes for a CAM semiconductor device according to another embodiment of the invention.

Figure 16A:
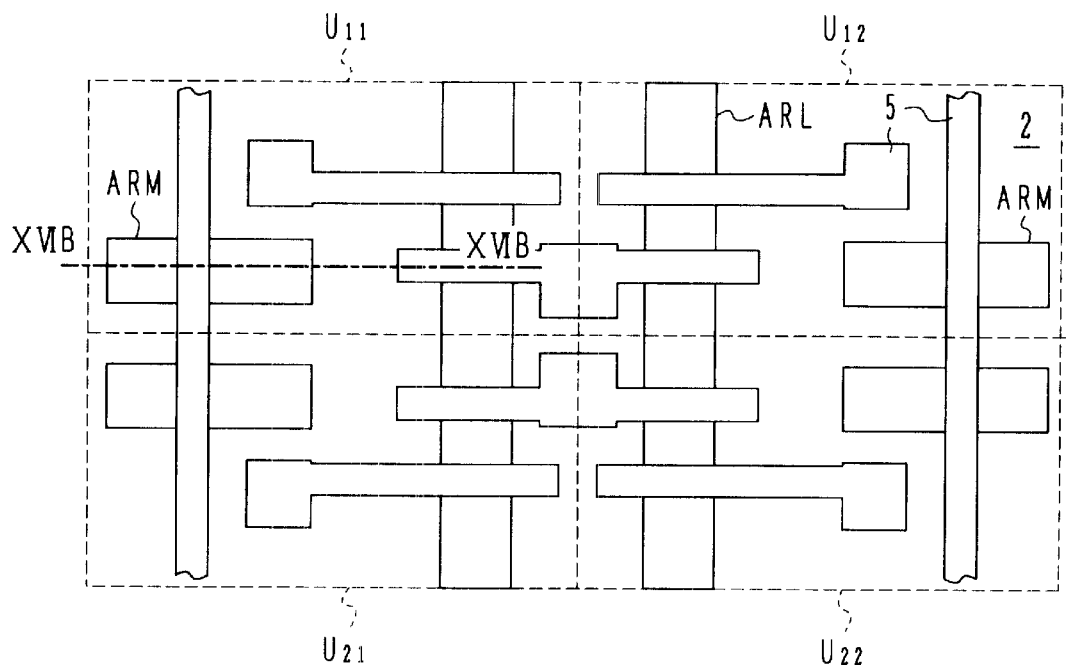
FIGS. 16A and 16B are a plan view and a cross sectional view illustrating a manufacture method for a semiconductor device according to another embodiment of the invention.
Figure 16B:
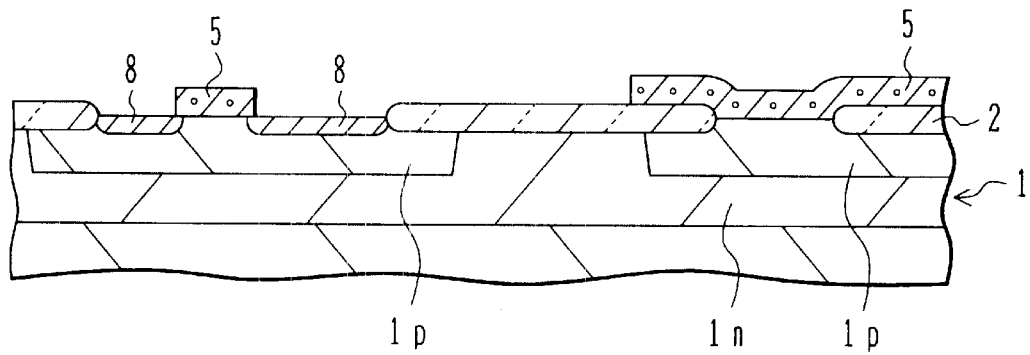

FIG. 16A and 16B are a plan view and a cross sectional view illustrating a process of defining active regions in a semiconductor substrate and forming a gate electrode on a gate oxide film formed on the active region.

As shown in FIG. 16B, on the surface of a semiconductor substrate 1, field insulating regions 2 for element isolation are formed by LOCOS or STI, the field insulating region being made of a silicon oxide film or the like. The areas not formed with the field insulating regions 2 and having exposed surfaces of the semiconductor substrate 1 are active regions.

Well structures such as an n-type well 1n and a p-type well 1p are formed on the silicon substrate when necessary. Since the right and left p-type wells 1p are separated, hot electrons generated during the operation of a logic transistor will not reach a DRAM cell and excellent retention characteristics can be obtained. If a single well is used for both the p-type wells, the cell size can be reduced although the retention characteristics are degraded.

In the following drawings, the well structure is not drawn for the simplicity of drawings. After a gate insulating film such as a silicon oxide film is formed on the surfaces of active regions of the silicon substrate 1, a polysilicon layer is deposited and patterned to form a gate electrode (including a signal line) 5.

After the gate electrode is formed, by using a resist mask if necessary, impurity ions are implanted into the active region to form source/drain regions 8 of a memory element transistor and source/drain regions of a logic element transistor.

In the plan view shown in FIG. 16A, logical element active regions ARL are formed extending in a vertical direction in a central area in FIG. 16A, and memory element active regions ARM are formed extending in a horizontal direction on both sides of the regions ARL. Gate electrodes 5 are formed extending in the horizontal direction over the logic element active region ARL, and gate electrodes are formed extending in the vertical direction over the memory element active regions ARM and on the insulating regions as wiring lines. In FIG. 16A, four repetitive units U11, U12, U21 and U22 are shown. The repetitive units U11 and U21 are in right/left bilateral symmetry with the repetitive units U12 and U22, whereas the repetitive units U11 and U12 are in up/down bilateral symmetry with the repetitive units U21 and U22.

Figure 17A:
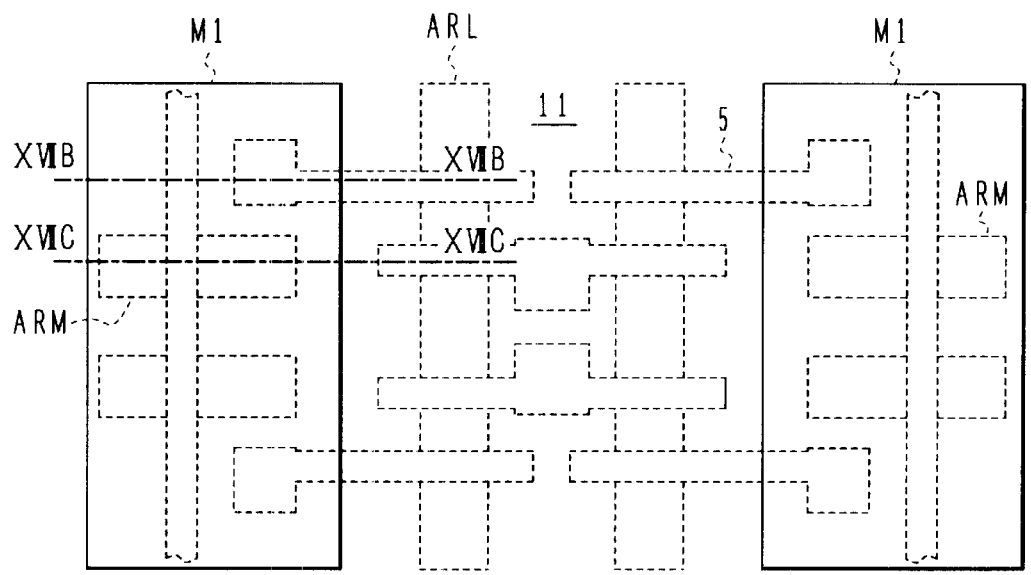
FIGS. 17A, 17B and 17C are a plan view and cross sectional views illustrating the manufacture method for a semiconductor device according to the embodiment.
Figure 17B:
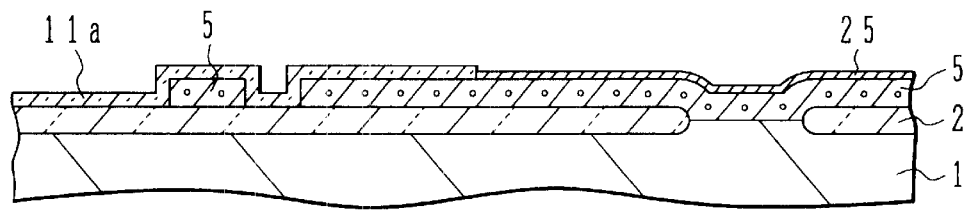
Figure 17C:
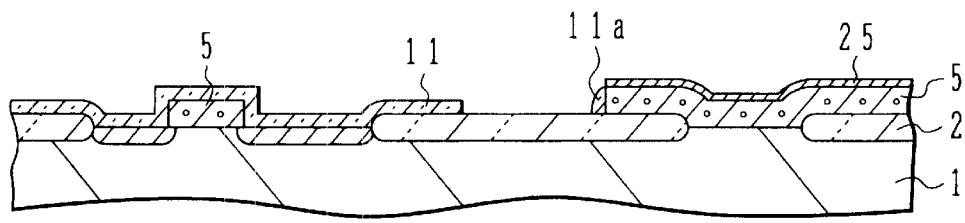

FIGS. 17A, 17B and 17C illustrate a process of forming an insulating film such as a silicon oxide film over the silicon substrate 1 to cover the gate electrodes, and removing part of the insulating film to perform a salicide process.

As shown in FIG. 17A, a silicon oxide film 11 is deposited over the whole surface of the silicon substrate, covering the gate electrodes. A mask M1 of photoresist or the like is formed on the silicon oxide film 11. The mask M1 covers the memory element area and exposes the logic element area. In this state, the silicon oxide film 11 is anisotropically etched. The silicon oxide film 11 is left unetched in the area covered with the mask M1. In the logic element area exposed in an opening of the mask M1, the silicon oxide film on the flat surface is removed and side wall spacers 11a are left only on the side walls of each gate electrode.

FIG. 17C shows the side wall spacer 11a formed on the side wall of the gate electrode 5.

After the side wall spacers 11a are formed, ions are implanted into the active regions in the logic element area to form source/drain regions of each transistor having a high impurity concentration. The transistor in the logic element area has therefore the LDD structure. The mask M1 is removed thereafter.

If a CMOS semiconductor device is to be manufactured, after the side wall spacers are formed, the mask M1 is removed. Next, photoresist is coated to form a photoresist pattern having an opening at each position corresponding to an NMOS in the logic element area. By using this photoresist pattern, n-type impurity ions are implanted at a high concentration to form $n^+$-type source/drain regions. After the photoresist pattern is removed, photoresist is newly coated to form a photoresist pattern having an opening at each position corresponding to a PMOS. By using this photoresist pattern, $BF_2$ ions are implanted at a high concentration to form $p^+$-type source/drain regions. Thereafter, this photoresist pattern is removed.

A Co film is formed on the whole surface of the silicon substrate by sputtering. After the Co film is formed, a heat treatment by RTA or the like is performed to conduct silicidation between the Co film and underlying silicon. In this manner, a suicide film 25 is formed on the surface of the gate electrode 5. A suicide film is also formed on the surface of the logic element active region ARL shown in FIG. 17A.

In place of the oxide film used as the side wall spacer, a nitride film may be used.

Figure 18A:
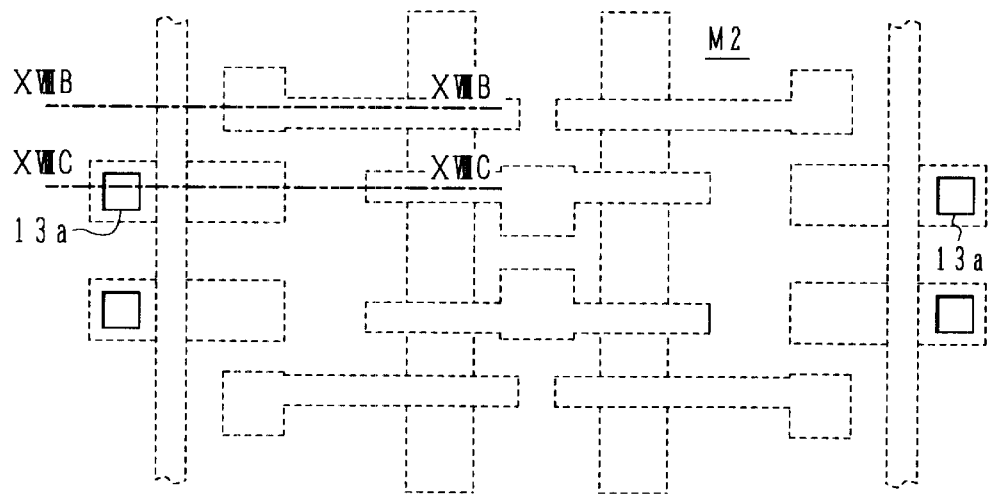
FIGS. 18A, 18B and 18C are a plan view and cross sectional views illustrating the manufacture method for a semiconductor device according to the embodiment.
Figure 18B:
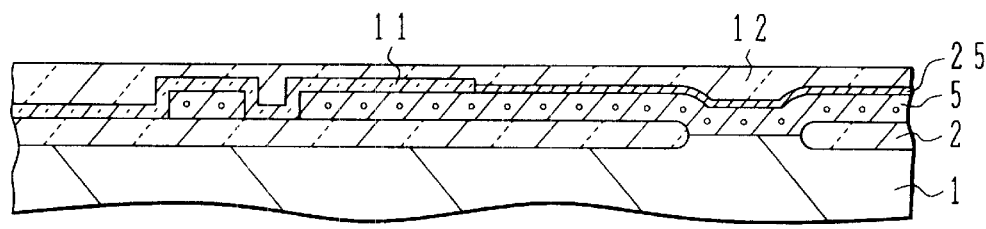

As shown in FIG. 18B, an interlevel insulating film 12 of BPSG or lamination layer of SiN and BPSG or the like is formed on the whole surface of the substrate 1, covering the silicon oxide film 11 and silicide layer 25. After the insulating film 12 is formed, the surface thereof is planarized by reflow, CMP or the like. A resist layer is formed on the surface of the insulating film 12 to form a mask M2 having openings for forming contact holes.

FIG. 18A is a plan view showing openings of the mask M2. The mask M2 has an opening 13a at a position corresponding to a bit line contact in the memory element area.

Figure 18C:
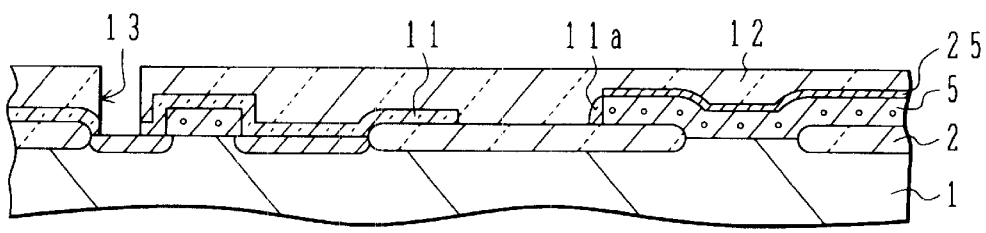

FIG. 18C shows an opening 13 formed through the insulating film 12 by using the mask M2.

Figure 19A:
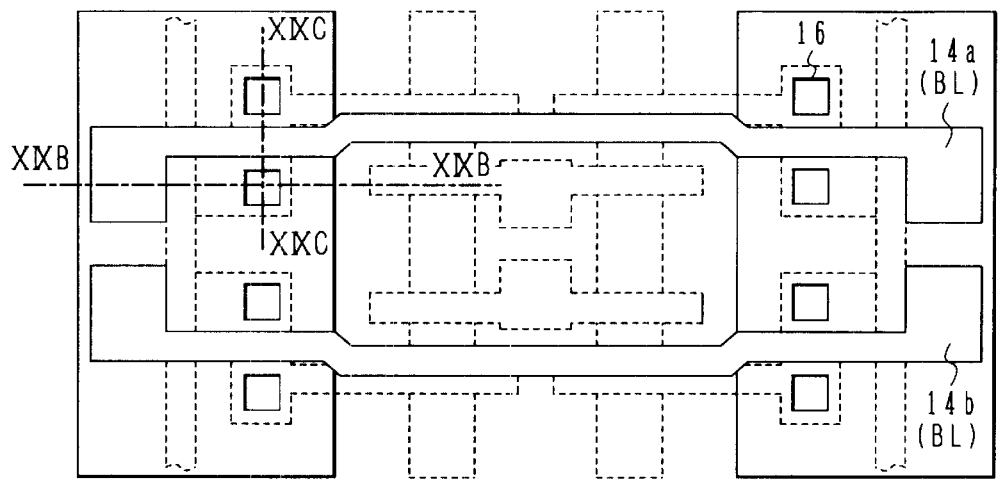
FIGS. 19A, 19B and 19C are a plan view and cross sectional views illustrating the manufacture method for a semiconductor device according to the embodiment.
Figure 19B:
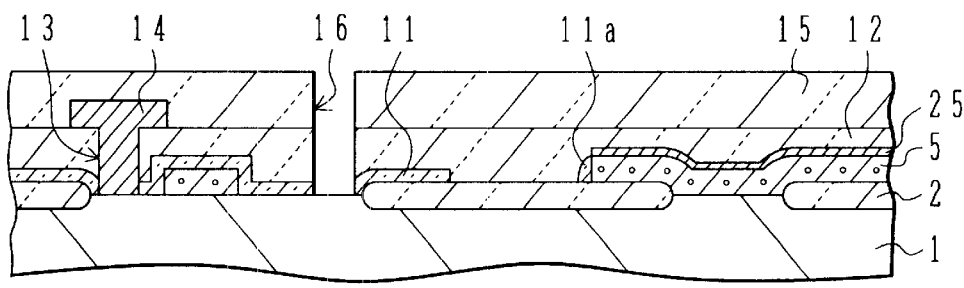

As shown in FIG. 19B, a conductive layer is formed on the insulating film 12, filling the opening 13. The conductive film is a lamination of a polysilicon layer and a WSi layer, or the like. The conductive layer is patterned to form a wiring layer 14 pattern constituting the bit line BL and the like. The bit line extends over the connection node of serially connected logic transistors. Therefore, a sufficient distance can be obtained between the bit line and the source/drain contact holes of the logic transistors to be later formed. This point is significant in realizing a high speed operation by using low resistance wiring material such as Al to form signal lines such as ML and DB.

Figure 19C:
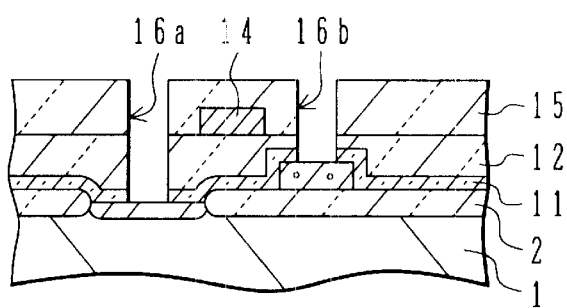

FIG. 19A shows a plan view of the layout of bit lines 14a and 14b. As shown in FIGS. 19B and 19C, after the bit lines 14 are formed, another interlevel insulating film 15 is formed on the insulating film 12, covering the bit lines 14. A mask made of photoresist or the like is formed on the insulating film 15 and capacitor contact holes 16 are formed through etching.

As shown in FIG. 19C, a contact hole 16a reaching the source/drain region of a memory cell transistor and a contact hole 16b reaching the gate electrode of the logic element are formed facing each other via the bit line 14. This structure that the contact holes are formed on both sides of the bit line allows the cell size to be reduced in the horizontal direction. It is preferable to planarize the insulating film 15 by reflow, CMP or the like.

Figure 20A:
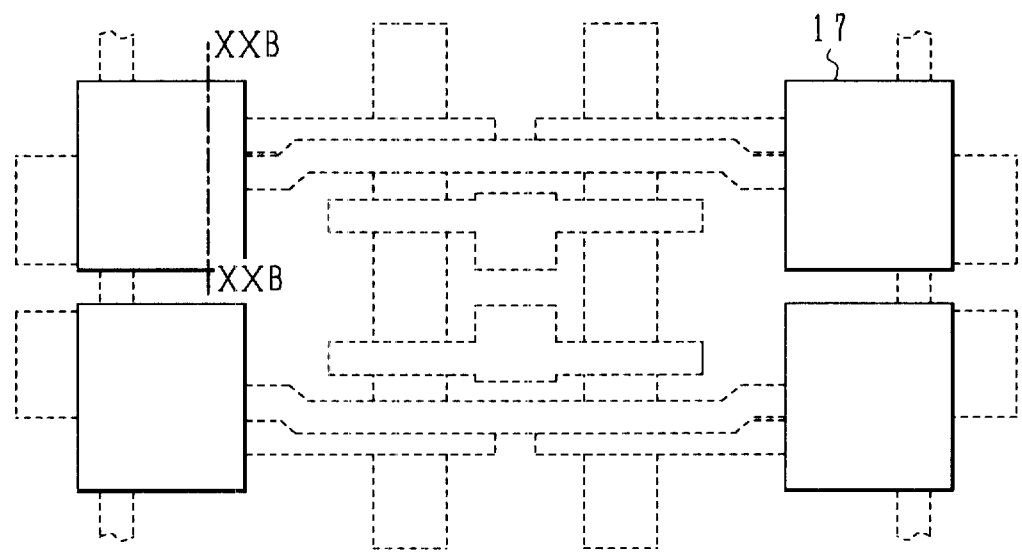
FIGS. 20A and 20B are a plan view and a cross sectional view illustrating the manufacture method for a semiconductor device according to the embodiment.
Figure 20B:
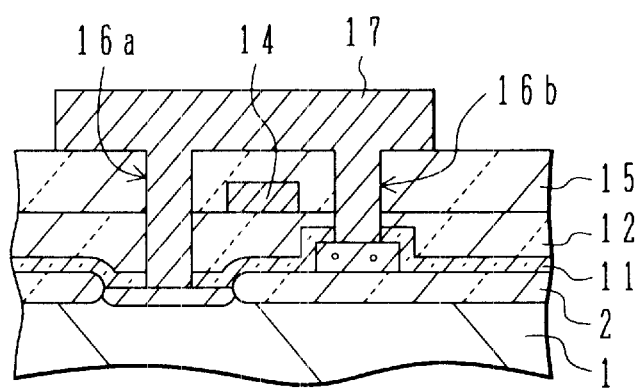

As shown in FIG. 20B, a conductive film such as polysilicon is deposited filling the contact holes 16a and 16b, and patterned to form a storage capacitor electrode 17.

As shown in FIG. 20A, the storage capacitor electrode 17 covers the main area of the memory cell transistor and has a rectangular plan shape. Although a pillar type storage capacitor electrode is used, a cylinder type or other shapes may also be used. A number of hemispherical projections may be formed on the surface of the electrode to increase the surface area.

Figure 21A:
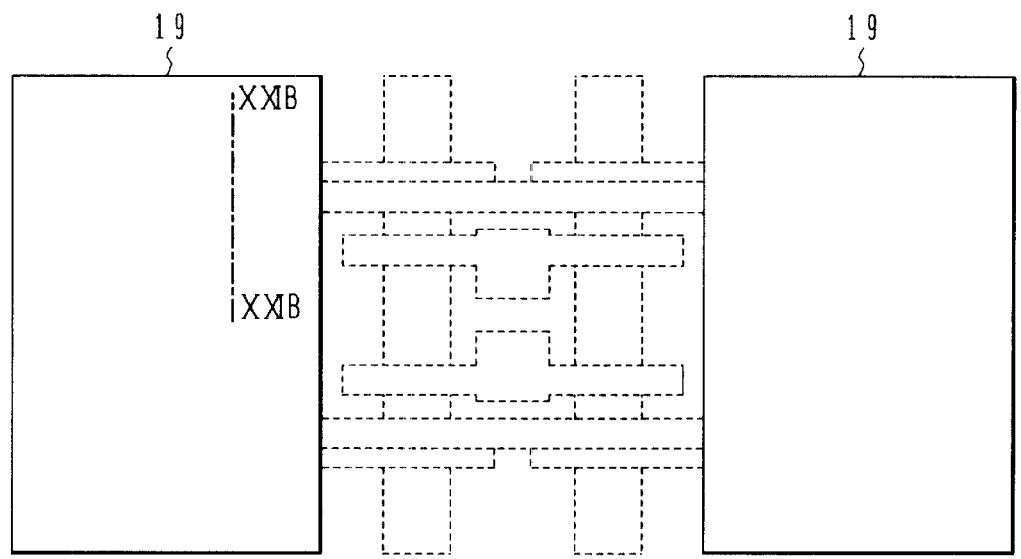
FIGS. 21A and 21B are a plan view and a cross sectional view illustrating the manufacture method for a semiconductor device according to the embodiment.
Figure 21B:
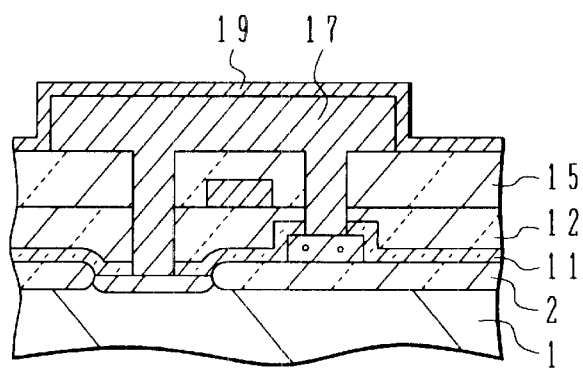

As shown in FIG. 21B, after a capacitor dielectric film is formed covering the storage capacitor electrode 17, a conductive film is formed and patterned to form cell plate electrodes 19.

As shown in FIG. 21A, the cell plate electrode 19 covers almost the whole surface of the memory element area. The cell plate electrode 19 extends to the area not shown in FIG. 21A and is maintained at the same potential (e.g., Vcc/2).

Figure 22:
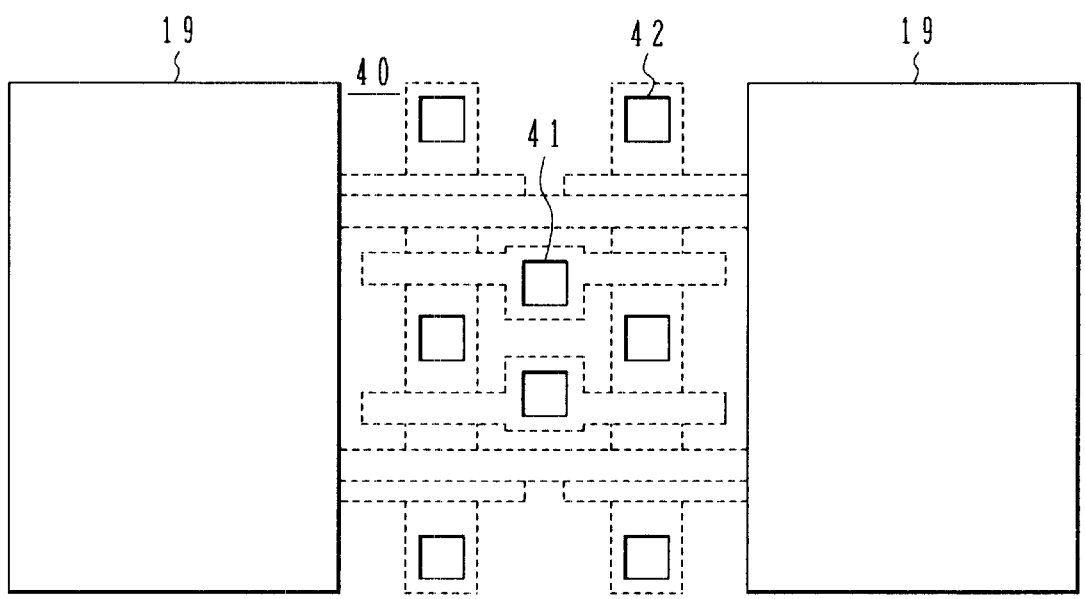
FIG. 22 is a plan view illustrating the manufacture method for a semiconductor device according to the embodiment.

As shown in FIG. 22, an interlevel insulating film 40 is formed over the whole surface of the silicon substrate, covering the cell plate electrodes 19. By using a resist mask or the like, contact holes 41 and 42 are formed.

Figure 23:
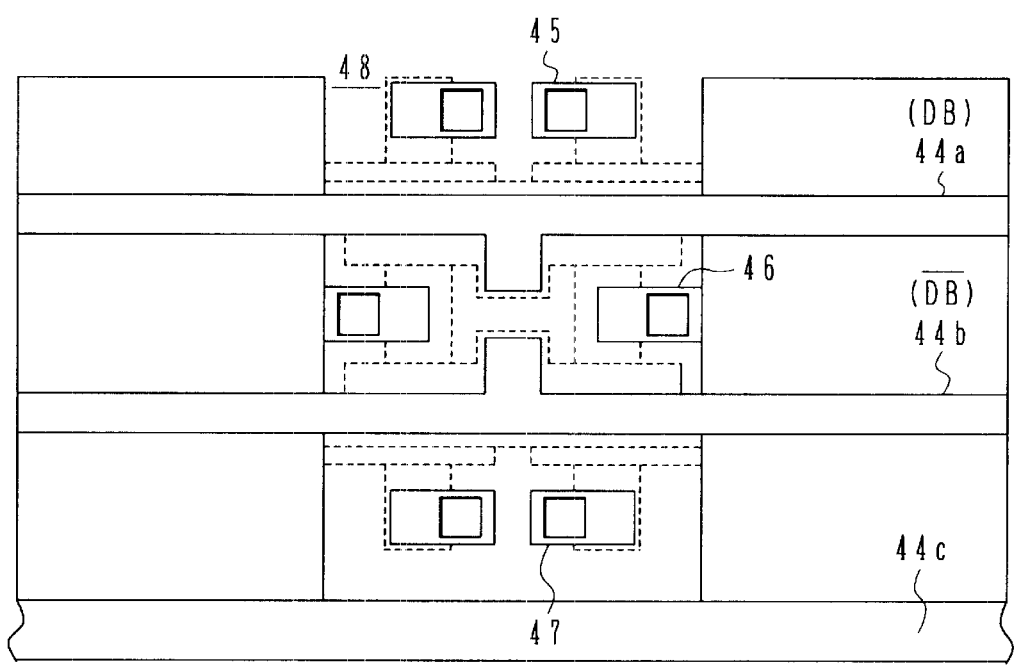
FIG. 23 is a plan view illustrating the manufacture method for a semiconductor device according to the embodiment.
Figure 23:
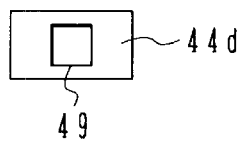
Figure 23:
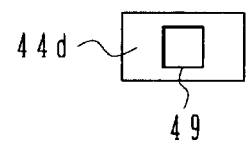

As shown in FIG. 23, a metal wiring layer is formed over the whole surface of the silicon substrate, filling the contact holes. The metal wiring layer is patterned to form data bus lines 44a and 44b and deriving or lead electrodes 45, 46 and 47 for the source-drain regions of logic element transistors. The electrodes 45 and 47 are so disposed that right and left adjacent electrodes become near to each other, and the electrodes 46 are so disposed that right and left adjacent electrodes become remote from each other.

With this disposal, the match line ML and ground line GND can be disposed along the same direction and made of the same wiring layer. Since the data bus line DB is made of the first-level (lower) wiring layer and the match line ML and ground line GND are made of the second-level (upper) wiring layer, the positions of the contact holes 41 and 42 can be simplified and the area of the logic circuit can be reduced.

As seen from the layout of the contact holes shown in FIG. 22, on both sides of the contact hole 41, the contact holes 42 are disposed. The layout of the wiring lines to these contact holes determines the area of each cell. The above-described layout is optimum from the viewpoint of a cell size.

It is also preferable to form cell plate contact holes and word lead line deriving contact holes and form, power source lines 44c for connection to the cell plate electrodes and stack electrodes 44d for connection to the word lines WL via the contact holes at the same time. For example, as shown in FIG. 23, power source lines 44c connected to the upper and lower sides of the cell plates, p-type well regions are formed. The stack electrodes 44d to be connected to the word lines are formed between adjacent cell blocks. The power source line to be connected to the cell plate may be made of the wiring layer same as the match line.

Thereafter, an interlevel insulating film 48 is formed over the whole surface of the substrate. It is preferable to planarize the surface of the insulating film 48 by reflow, CMP or the like. A photoresist pattern is formed on the insulating film 48, and contact holes 49 are formed.

Figure 24A:
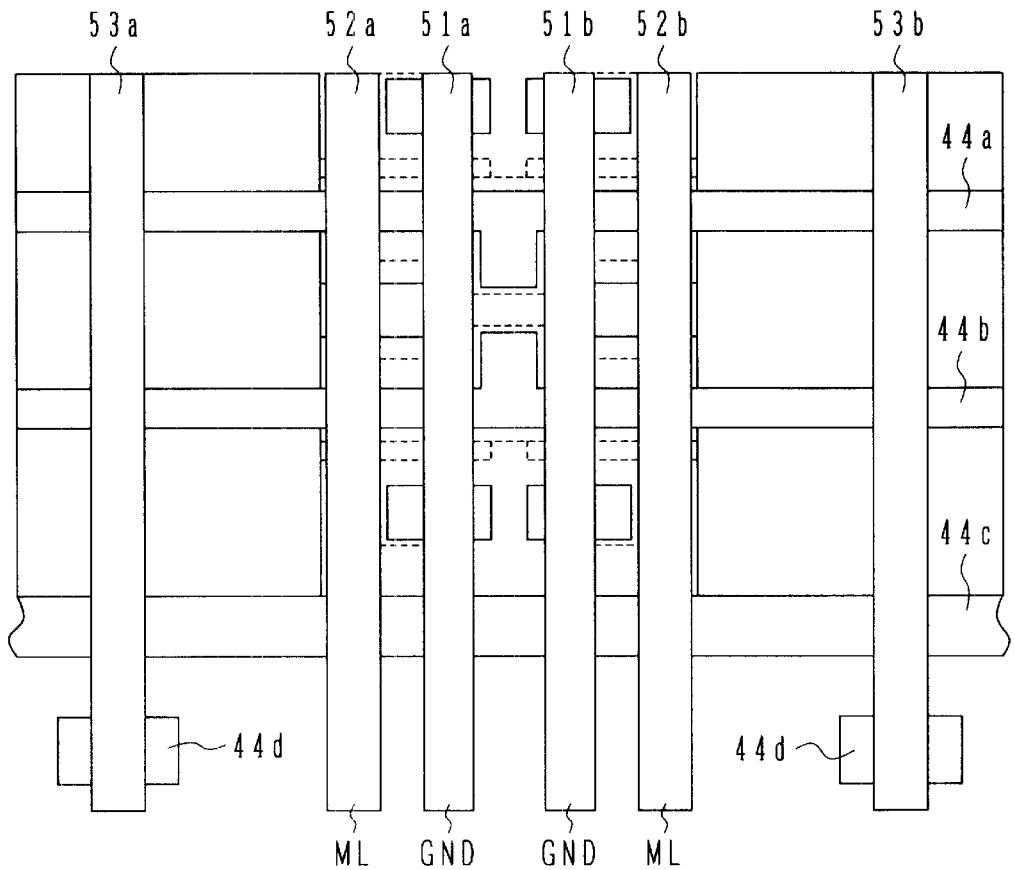
FIGS. 24A and 24B are a plan view illustrating the manufacture method for a semiconductor device according to the embodiment and a plan view showing the layout of electrodes.

As shown in FIG. 24A, an upper metal wiring layer is formed filling the contact holes, and patterned to form wiring lines 51a and 51b (collectively called a wiring line 51) and wiring lines 52a and 52b (collectively called a wiring line 52) extending in the vertical direction. For example, the wiring lines 51a and 51b are ground lines, and the wiring lines 52a and 52b are match lines. At the same time, word line backing lines 53a and 53b are formed which back up the word lines together with the lower stack electrodes 44d. The word line is made of polysilicon or polycide extending in the vertical direction and has a relatively large resistance. By connecting the word line to the backing line between adjacent cell blocks, the resistance of the word line can be lowered considerably.

Figure 24B:
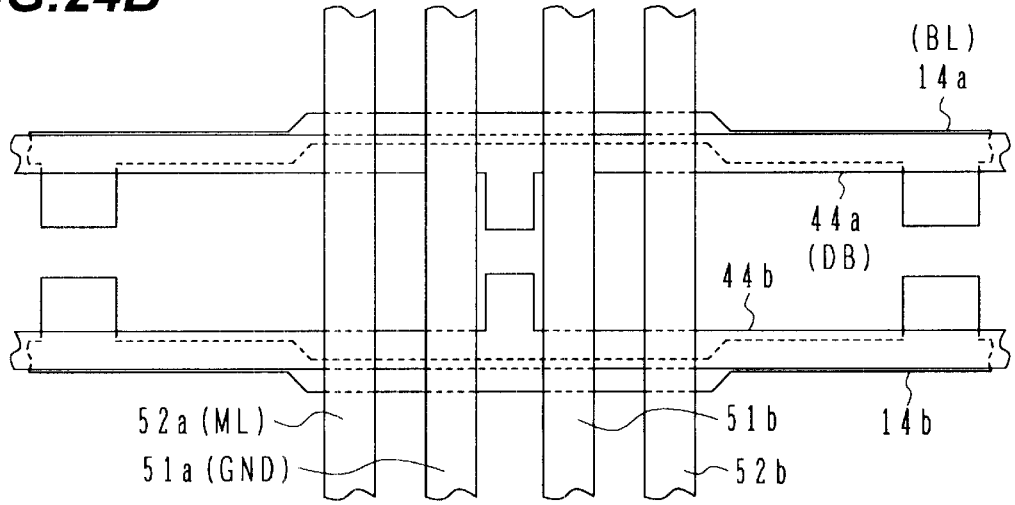

FIG. 24B shows the layout of wiring lines formed at a level higher than that of the gate electrode (word line). Bit lines BL (14a and 14b) are formed extending in the horizontal direction, and data bus lines 44a and 44b (and cell plate power source line 44c) made of a metal wiring layer are formed extending in the horizontal direction and overlapping bit lines BL. In the highest layer, match lines ML and ground lines (and word line backing lines) are formed extending in the direction generally perpendicular to the direction of the bit lines BL and data bus lines DB.

The match line ML, data bus line DB and ground line GND made of the metal wiring layer are used for the connection to the logic element area. A high speed operation is therefore possible.

In this embodiment, a CAM cell is made of two DRAM cells and four n-channel transistors. The number of DRAM cells may be reduced.

Figures 25A, 25B:
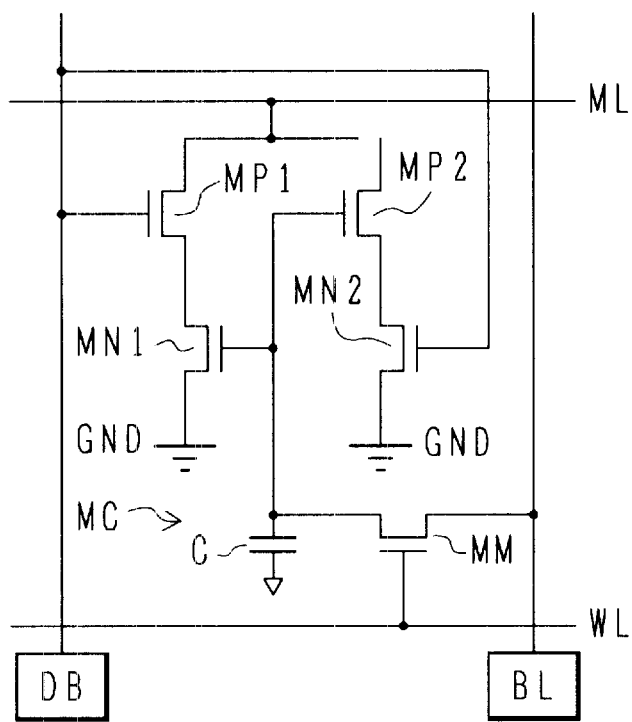
FIGS. 25A and 25B are an equivalent circuit diagram and a logic table of a CAM according to another embodiment of the invention.

FIG. 25A is an equivalent circuit of a CAM cell according to another embodiment of the invention.

A memory cell MC is made of a memory cell transistor MM and a capacitor C. Two sets of serially connected transistors are connected between a match line ML and a ground line GND. One set of serially connected transistors is made of a p-channel transistor MP1 and an n-channel transistor MN1, and the other set is made of a p-channel transistor MP2 and an n-channel transistor MN2. A data bus line DB is connected to the gate electrodes of the p- and n-channel transistors MP1 and MN2.

The storage electrode of the memory cell is connected to the gate electrodes of the p- and n-channel transistors MP2 and MNI. The serially connected transistors are made of CMOS transistors, one being controlled by the potential at the data bus line DB and the other being controlled by the storage electrode potential of the capacitor C. The bit line BL is connected to the other source/drain region of the memory cell transistor MM.

In the CAM cell shown in FIG. 1A, the memory cell MC is made of two DRAM cells, whereas in the CAM cell shown in FIG. 25A, the memory cell MM is made of one DRAM cell. Furthermore, in FIG. 1A, two data bus lines and two bit lines are used for the CAM cell, whereas in FIG. 25A, one data bus line DB and one bit line BL are used.

FIG. 25B is a table showing the logic operation of the CAM cell shown in FIG. 25A. A DRAM row field indicates a potential of the storage electrode of the capacitor C, H representing a high potential and L representing a low potential. A DB row field indicates a potential of the data bus line DB, H representing the high potential and L representing the low potential. A PMOS row field indicates an on/off state of the p-channel transistor MP1/MP2. An NMOS row field indicates an on/off state of the n-channel transistor MN1/MN2. An ML row field indicates whether the match line ML precharged to the high potential maintains the high potential or discharges to the low potential, after the logic operation.

For example, when DRAM takes the high potential (H), the n-channel transistor MN1 is on and the p-channel transistor MP2 is off. When the data bus line DB takes the high potential (H), the p-channel transistor MP1 is off and the n-channel transistor MN2 is on. Accordingly, when both DRAM and DB take H, in each set of serially connected transistors, one transistor is on and the other transistor is off. The match line ML is therefore maintained at H.

When DB takes H and DRAM takes L, the n-channel transistor MN1 is off and the p-channel transistor MP2 is on. Therefore, the serial connection of the p-channel transistor MP2 and n-channel transistor MN2 is on and the match line ML is discharged to L.

When DRAM takes H and DB takes L, the p-channel transistor MP1 is on and the n-channel transistor MN2 is off. Therefore, the other serial connection of the transistors MP1 and MN1 is on and the match line ML is discharged to L.

When both DRAM and DB take L, the state changes to the state opposite to that when both DRAM and DB take H, and both the n-channel transistors MN1 and MN2 are off so that the match line ML is not discharged and it maintains H.

In the manner described above, the CAM cell shown in FIG. 25A performs the same logic operation as that of the CAM cell shown in FIG. 1A. Manufacture processes for the CAM cell shown in FIG. 25A will be described with reference to FIGS. 26A to 29.

Figure 26A:
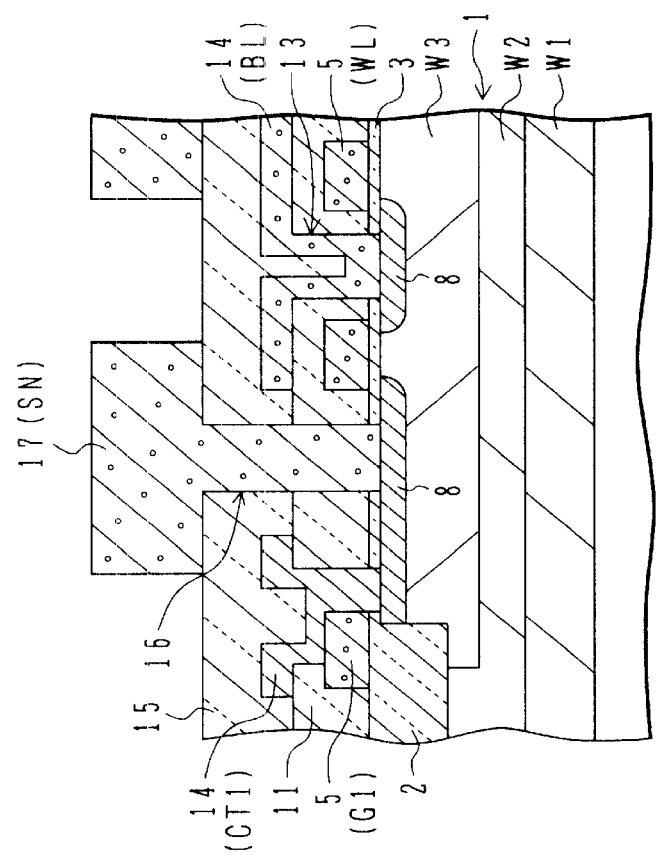
FIGS. 26A and 26B are a plan view and a cross sectional view illustrating a manufacture method for CAM shown in FIG. 25.

As shown in FIG. 26A, on the surface of a silicon substrate 1, field insulating regions 2 for defining active regions ARL1, ARL2 and ARM are formed by LOCOS or STI. The active region ARL1 is an n-type well for logic elements in which p-channel transistors are formed. The active region ARL2 is a p-type well for logic elements in which n-channel transistors are formed. The active region ARM is a p-type well in which memory element transistors are formed. After a gate oxide film is formed on the surface of the active region, a polysilicon layer is deposited and patterned to form the gate electrode of each transistor. In the logic element area, gate electrodes G1 and G2 are formed. Each gate electrode G1, G2 has a portion traversing the n-type active region ARL1 and a portion traversing the p-type active region ARL2. In the memory element area, a word line WL also serving as the gate electrode traverses the p-type active region ARM in the horizontal direction.

After an interlevel insulating film covering the gate electrodes is formed, a second-level layer polysilicon layer is deposited and patterned to form a bit line BL and a connection terminal CT1 for connecting the logic element gate electrode G1 to one of the source/drain regions of the memory transistor. A second interlevel insulating film is formed covering the second-level polysilicon layer, and a third-level polysilicon layer is deposited and patterned to form a storage electrode SN of the memory transistor. The three polysilicon layers form the lower wiring layers.

Figure 26B:
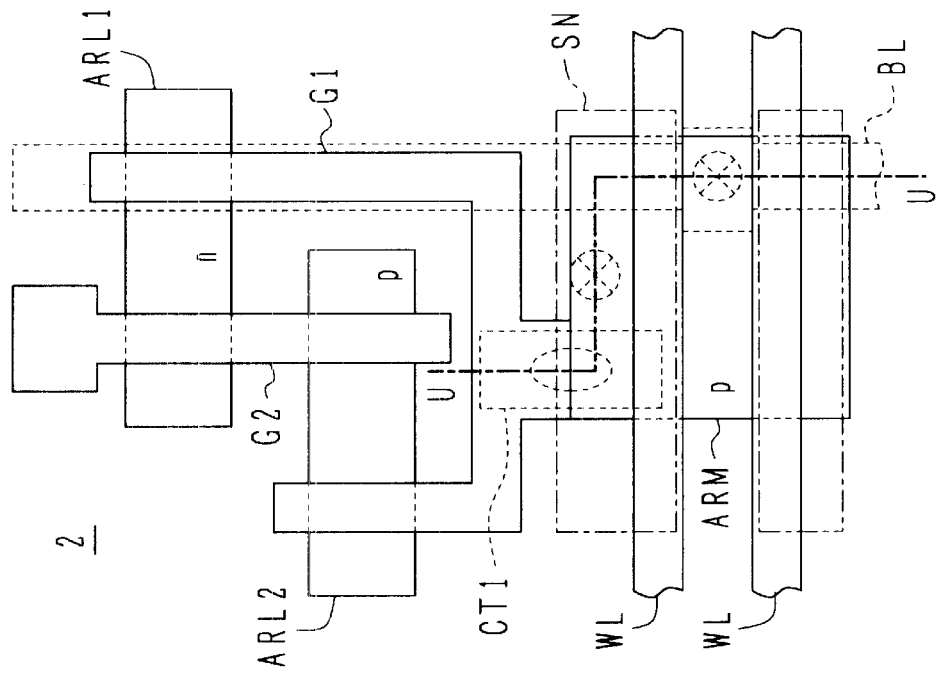

FIG. 26B shows the cross sectional structure taken along one-dot chain line U—U shown in FIG. 26A. A deep $n^+$-type buried layer W1 is formed in the surface layer of the silicon substrate 1, and an n-type well W2 is formed on the buried layer W1. In a partial area of the n-type well W2, a p-type well W3 is formed. In addition to the p-type well W3, an n-type well is also formed in which p-channel transistor are formed. A field insulating region 2 is formed through STI in the surface layer of the silicon substrate 1. A gate oxide film 3 is formed on the surface of the active region defined by the field insulating region 2.

A polysilicon layer 5 to be used as the gate electrode is formed on the gate oxide film 3. On both sides of the polysilicon layer 5, source/drain regions 8 are formed through ion implantation of n-type impurities. In the logic element area, on both sides of each gate electrode, source/drain regions of a corresponding conductivity type are formed. A first interlevel insulating film 11 is formed covering the gate electrode. The first interlevel insulating film 11 is made of two insulating layers. In the logic element area, a lower insulating layer is anisotropically etched to form side wall spacers on both sides of the gate electrode. After the side wall spacers are formed, ion implantation is performed to form high concentration source/drain regions.

A contact hole 13 is formed through the first interlevel insulating film 11, and a polysilicon layer is deposited filling the contact hole 13. The polysilicon layer is patterned to form a polysilicon wiring pattern 14 constituting a connection terminal CT1 and a bit line BL.

A second interlevel insulating film 15 is formed covering the polysilicon wiring pattern 14. A contact hole 16 is formed from the surface of the second interlevel insulating film to one of the source/drain regions of the memory element transistor. A polysilicon layer is deposited filling the contact hole 16. The polysilicon layer is patterned to form a memory element storage electrode 17.

In this embodiment, the connection terminal CT1 connects the gate electrode 5 (G1) and source/drain region 8, and the storage electrode 17 of the capacitor extends downward to be connected to the source/drain region 8. Similar to the embodiment described earlier, one or two connection terminals may connect the storage electrode, gate electrode 5 (G1) and source/drain region 8.

Figure 27:
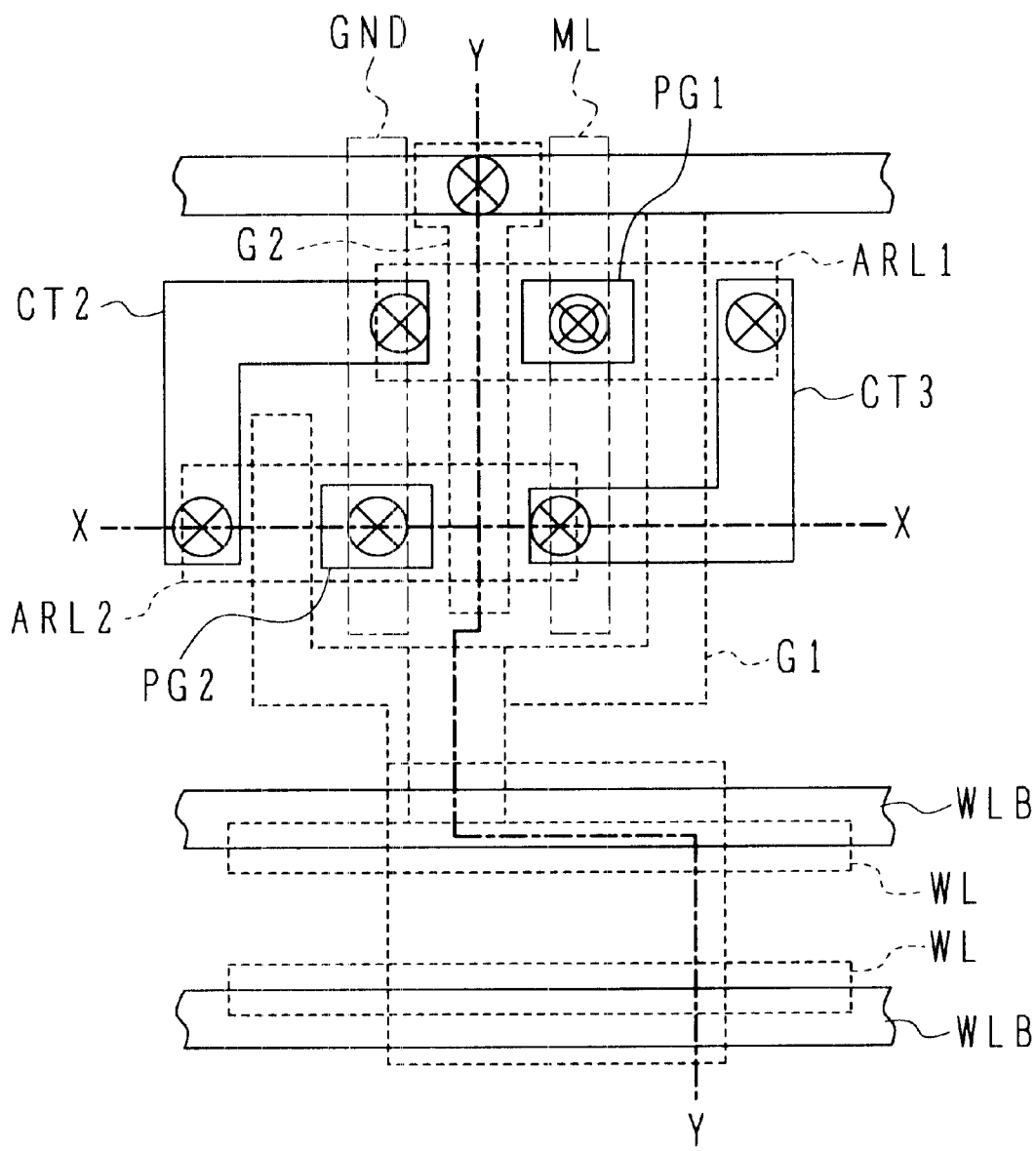
FIG. 27 is a plan view illustrating the manufacture method for CAM shown in FIG. 25.

As shown in FIG. 27, a third interlevel insulating film is formed on the second interlevel insulating film 15, covering the storage electrode. A first metal wiring layer is formed on the third interlevel insulating film. The first metal wiring layer is patterned to form a data bus line DB, interconnect wiring lines CT2 and CT3 for connecting p- and n-channel transistors, plugs PG1 and PG2 for the connection to an upper wiring layer, and a word line backing line WLB in the memory element area. After the first metal wiring layer is patterned, a fourth interlevel insulating film is formed and a second metal wiring layer is formed thereon. The second metal wiring layer is patterned to form a ground line GND and a match line ML extending in the vertical direction.

Figure 28:
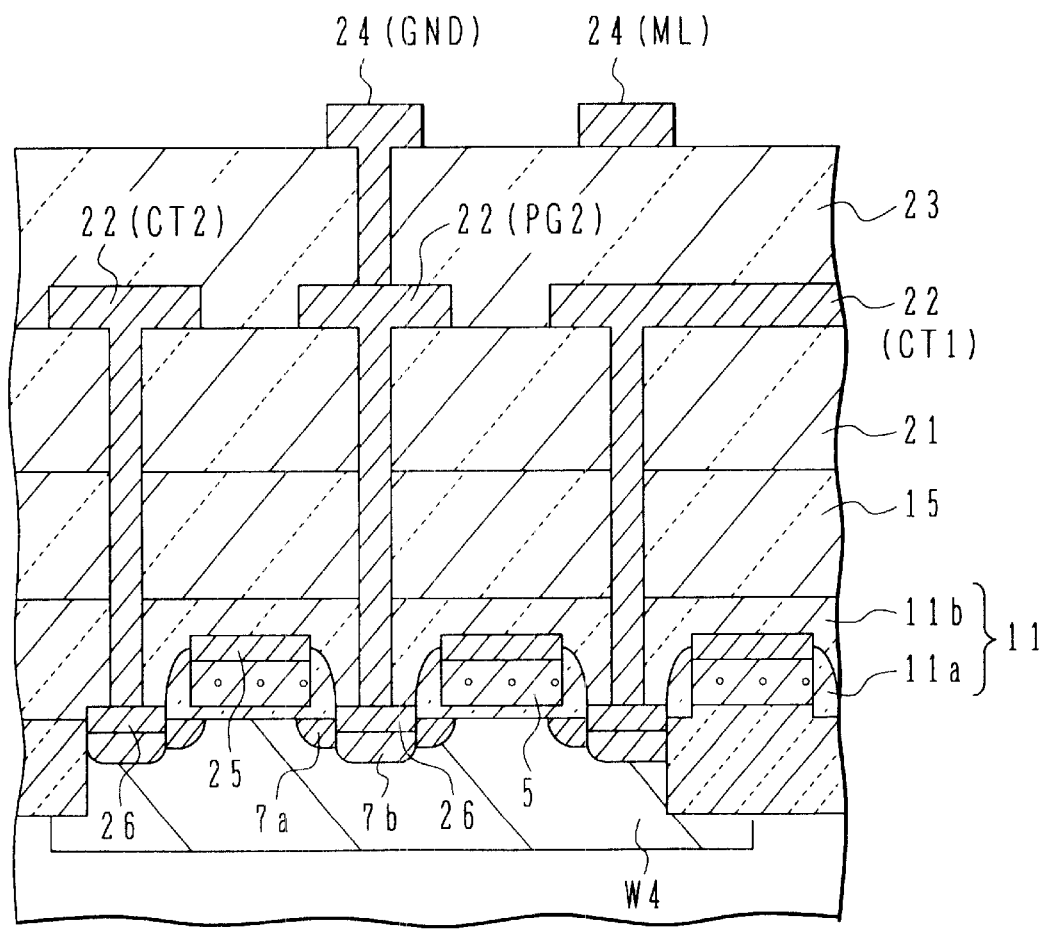
FIG. 28 is a cross sectional view illustrating the manufacture method for CAM shown in FIG. 25.

FIG. 28 shows a cross sectional structure taken along line X—X shown in FIG. 27. In the logic element active region ARL2, a p-type well W4 is formed. A silicide layer 25 is formed on the upper surface the polysilicon gate electrode 5. On both sides of the gate electrode 5, LDD structures are formed having low concentration source/drain regions 7a and high concentration source/drain regions 7b. A silicide layer 26 is formed on the surface of each of these regions 7b. The first interlevel insulating film 11 forms side wall spacers 11a on the side walls of the gate electrode and an upper insulating film 11b.

The second interlevel insulating film 15 is formed on the first interlevel insulating film 11, and after the memory element capacitor is formed, the third interlevel insulating film 21 is formed. After the contact hole is formed through the third interlevel insulating film, the first metal wiring layer 22 is formed. In the structure shown in FIG. 28, the first metal wiring layer 22 forms the interconnect wiring lines CT1 and CT2 and plugs PG2.

The fourth interlevel insulating film 23 is formed on the first metal wiring layer 22, and after the contact hole is formed, the second metal wiring layer 24 is formed. The ground wiring line 24 is connected to the plug PG2. The match line ML is also connected to the plug PG1 in an area not shown in FIG. 28.

Figure 29:
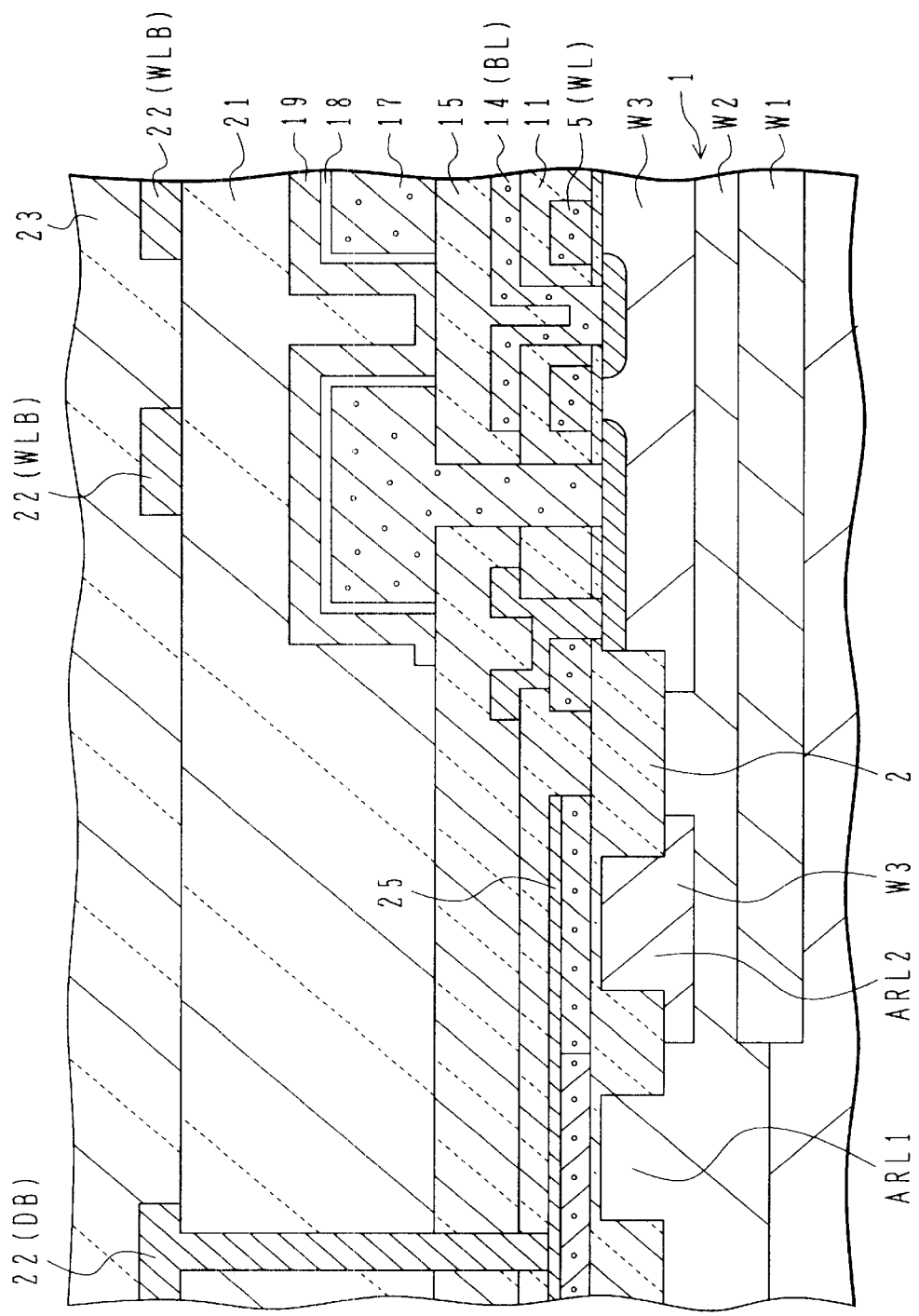
FIG. 29 is a cross sectional view illustrating the manufacture method for CAM shown in FIG. 25.

FIG. 29 shows a cross sectional structure taken along line Y—Y shown in FIG. 27. The logic element active region ARL1 is the n-type well W2, and the logic element active region ARL2 is the p-type well W3 in the n-type well W2. The gate electrode on the n-type well W2 is made of p-type polysilicon doped with a large amount of p-type impurities. The logic element gate electrode 5 on the p-type well W3 is made of n-type polysilicon doped with a large amount of n-type impurities. The silicide layer 25 is formed on the surface of each gate electrode 5.

In the memory element area, in addition to the structure shown in FIG. 26B, a capacitor dielectric film 18 and a cell plate electrode 19 are formed to constitute the memory element capacitor together with the storage electrode 17. The third interlevel insulating film 21 is formed covering the capacitor, and the contact hole reaching the gate electrode G1 is formed through the third interlevel insulating film 21. The first metal wiring layer 22 is formed on the third interlevel insulating film 21.

The first metal wiring layer 22 forms the data bus line DB connected to the gate electrode G2 and the word line backing line WLB. The fourth interlevel insulating film 23 is formed covering the first metal wiring layer 22, and the second metal wiring layer shown in FIG. 28 is formed. Other interlevel insulating films and upper wiring layers are formed if necessary to complete a semiconductor device.

Logic element transistors of this CAM cell can operate at high speed because they are driven by the data bus line DB, match line ML, ground line GND and interconnect lines, respectively made of low resistance metal.

Various layouts may be used depending upon the peripheral circuit structure and the like. Although the invention has been described in connection with the above embodiments, the invention is not limited thereto. It is apparent that various modifications, improvements, and combinations can be made by those skilled in the art.

What is claimed is:

1. A semiconductor device comprising a semiconductor substrate and a plurality of basic units formed on said semiconductor substrate each having a memory element and a logic element and a same plan layout or a bilateral symmetry layout, said basic unit comprising:

an isolation insulating region formed on a surface of said semiconductor substrate for defining first and second active regions;

a transfer transistor having a first gate electrode formed traversing the first active region and a pair of first source/drain regions formed on both sides of the first gate electrode in the first active region;

a word line connected to the first gate electrode;

a bit line connected to one of the pair of first source/drain regions;

serially connected transistors having second and third gate electrodes formed traversing the second active region, a connection node formed between the second and third gate electrodes in the second active region, a pair of second source/drain regions formed outside the second and third gate electrodes, and in the second active region, and a silicide electrode formed on the connection node and on the pair of second source/drain regions;

a first signal line connected to the silicide electrode on one of the pair of second source/drain regions;

a second signal line connected to the silicide electrode on the other of the pair of second source/drain regions;

a third signal line connected to the second gate electrode;

a storage electrode formed in an area above the other of the first source/drain regions and at least a portion of the third gate electrode;

a capacitor dielectric film formed on a surface of said storage electrode;

a first conductive connection member formed on and under said storage electrode for connecting said storage electrode to the other of the first source/drain regions; and a second conductive connection member formed on and under said storage electrode for connecting said storage electrode to the third gate electrode.

2. A semiconductor device according to claim 1, wherein said first and second conductive connection members form an integral conductive connection member.

3. A semiconductor device according to claim 1, wherein said bit line is disposed between said first and second conductive connection members.

4. A semiconductor device according to any one of claims 1 to 3, wherein an impurity concentration of the connection node and the pair of second source/drain regions in the second active region is higher than an impurity concentration of the pair of first source/drain regions in the first active region.

5. A semiconductor device according to any one of claims 1 to 4, wherein said first conductive connection member includes a conductive plug formed on the other of the first source/drain regions and a first storage electrode extension made of a same material as said storage electrode and formed on said conductive plug.

6. A semiconductor device according to claim 5, wherein said conductive plug has a recess under said first storage electrode extension.

7. A semiconductor device according to any one of claims 1 to 4, wherein said second conductive connection member includes a second storage electrode extension made of a same material as said storage electrode.

8. A semiconductor device according to any one of claims 1 to 7, further comprising a bit line driver for driving said bit line, a word line driver for driving said word line, a match line driver for pre-charging said second signal line relative to a potential of said first signal line and detecting a voltage after pre-charging, and a data bus driver for driving said third signal line, respectively formed in an outer area of the plurality of basic units.

9. A semiconductor device according to claim 1 or 2, wherein said third gate electrode includes an intrinsic gate electrode portion formed on a gate insulating film on the second active region and a contact portion formed on said isolation insulating region and having an increased width, and said second conductive connection member connects said contact portion.

10. A semiconductor device according to claim 9, wherein said third gate electrode extends along a straight line, and the first active region extends along the same straight line near said contact portion.

11. A semiconductor device according to any one of claims 1 to 10, wherein a first group of two of said word line, bit line, and first to third signal lines is disposed in parallel and a second group of at least two of the remaining three is disposed in parallel and crosses said first group.

12. A semiconductor device according to claim 11, wherein said first group is formed by a first conductive layer and said second group is formed by a second conductive layer at a different layer level from the first conductive layer.

13. A semiconductor device according to claim 12, wherein said storage electrode is formed by a third conductive layer at a different layer level from the first and second conductive layers.

14. A semiconductor device comprising a semiconductor substrate and a plurality of basic units formed on said semiconductor substrate each having a memory element and a logic element and a same plan layout or a bilateral symmetry layout, said basic unit comprising:

an isolating insulating region formed on a surface of said semiconductor substrate for defining first and second active regions;

a transfer transistor having a first gate electrode formed traversing the first active region and a pair of first source/drain regions formed on both sides of the first gate electrode in the first active region;

a word line connected to the first gate electrode;

a bit line connected to one of the pair of first source/drain regions;

serially connected transistors having second and third gate electrodes formed traversing the second active region, a connection node formed between the second and third gate electrodes in the second active region, and a pair of second source/drain regions formed outside the second and third gate electrodes;

a first signal line connected to one of the pair of second source/drain regions and made of a first metal wiring layer;

a second signal line connected to the other of the pair of second source/drain regions and made of the first metal wiring layer;

a third signal line connected to the second gate electrode and made of a second wiring layer different in level from the first wiring layer;

a storage electrode formed in an area above the other of the pair of first source/drain regions and at least a portion of the third gate electrode;

a capacitor dielectric film formed on a surface of said storage electrode;

a first conducive connection member formed on and under said storage electrode for connecting said storage electrode to the other of the pair of first source/drain regions; and a second conductive connection member formed on and under said storage electrode for connecting said storage electrode to the third gate electrode.

15. A semiconductor device according to claim 14, wherein said serially connected transistors include silicide electrodes formed on the connection node and on the pair of second source/drain regions.

16. A semiconductor device according to claim 14, wherein said bit line is made of a third metal wiring layer at a level lower than the second wiring layer.

17. A semiconductor device according to claim 14, wherein said bit line and said third signal line are overlapped as viewed in plan.

18. A semiconductor device comprising a plurality of basic units formed on a semiconductor substrate each having a memory element and a logic element and a same layout or a bilateral symmetry layout, said basic unit comprising:

a DRAM cell formed in a first active region, said DRAM cell including a first transistor and a capacitor with a storage electrode;

a logic element formed in a second active region, said logic element having serially connected second and third transistors with second and third gates and silicide source/drain electrodes; and a conductive connection member formed on and under the storage electrode of said DRAM capacitor for connecting the storage electrode to the third gate electrode.

19. A semiconductor device comprising:

data bus lines to be applied with input signals;

match lines to be precharged;

memory cells each including an insulated gate type transistor and a capacitor;

a ground line;

logic cells each including first and second serial connections, the first and second serial connections each connected between said match line and said ground line and including serially connected p- and n-channel transistors, a gate electrode of an n-channel transistor of the first serial connection and a gate electrode of a p-channel transistor of the second serial connection being connected to storage electrodes of the capacitor, and a gate electrode of the p-channel transistor of the first serial connection and a gate electrode of the n-channel transistor of the second serial connection being connected to the data bus line.

20. A semiconductor device according to claim 19, wherein said data bus line, match line and ground line are made of metal wiring layers.

21. A semiconductor device according to claim 20, wherein the first and second serial connections each include a metal wiring connecting the n- and p-channel transistors.

* * * * *